United States Patent
Hwang et al.

(10) Patent No.: US 11,889,680 B2
(45) Date of Patent: Jan. 30, 2024

(54) INTEGRATED ASSEMBLIES AND METHODS OF FORMING INTEGRATED ASSEMBLIES

(71) Applicant: Micron Technology, Inc., Boise, ID (US)

(72) Inventors: David K. Hwang, Boise, ID (US); Richard J. Hill, Boise, ID (US); Gurtej S. Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 7 days.

(21) Appl. No.: 17/376,077

(22) Filed: Jul. 14, 2021

(65) Prior Publication Data

US 2022/0068932 A1     Mar. 3, 2022

Related U.S. Application Data

(60) Provisional application No. 63/072,033, filed on Aug. 28, 2020.

(51) Int. Cl.
*H10B 12/00* (2023.01)
*H01L 29/78* (2006.01)
(Continued)

(52) U.S. Cl.
CPC ....... *H10B 12/315* (2023.02); *H01L 29/0684* (2013.01); *H01L 29/42356* (2013.01);
(Continued)

(58) Field of Classification Search
CPC .......... H01L 29/0684; H01L 29/42356; H01L 29/66666; H01L 29/7827; H01L 29/78642;
(Continued)

(56) References Cited

U.S. PATENT DOCUMENTS 5,466,629 A * 11/1995 Mihara ............... H01L 28/60
257/E21.011
7,184,291 B2  2/2007 Bollu et al.
(Continued)

FOREIGN PATENT DOCUMENTS

| KR | 10-2005-008551 | 8/2005 |
|---|---|---|
| WO | WO PCT/US2021/045660 | 12/2021 |
| WO | WO PCT/US2021/045660 | 2/2023 |

OTHER PUBLICATIONS

Cao et al., "2-D Layered Materials for Next-Generation Electronics: Opportunities and Challenges", IEEE Transactions on Electron Devices vol. 65, No. 10, Oct. 2018, United States, pp. 4109-4121.
(Continued)

*Primary Examiner* — Mohammad M Hoque
*Assistant Examiner* — Kevin Quinto
(74) *Attorney, Agent, or Firm* — Wells St. John P.S.

(57) ABSTRACT

Some embodiments include an integrated assembly having first conductive structures extending along a first direction. Spaced-apart upwardly-opening container-shapes are over the first conductive structures. Each of the container-shapes has a first sidewall region, a second sidewall region, and a bottom region extending from the first sidewall region to the second sidewall region. Each of the first and second sidewall regions includes a lower source/drain region, an upper source/drain region, and a channel region between the upper and lower source/drain regions. The lower source/drain regions are electrically coupled with the first conductive structures. Second conductive structures extend along a second direction which crosses the first direction. The second conductive structures have gate regions operatively adjacent the channel regions. Storage elements are electrically coupled with the upper source/drain regions. Some
(Continued)

embodiments include methods of forming integrated assemblies.

44 Claims, 23 Drawing Sheets

(51) Int. Cl.
- *H01L 29/423* (2006.01)
- *H01L 29/66* (2006.01)
- *H01L 29/06* (2006.01)

(52) U.S. Cl.
CPC .... *H01L 29/66666* (2013.01); *H01L 29/7827* (2013.01); *H10B 12/0335* (2023.02); *H10B 12/482* (2023.02); *H10B 12/488* (2023.02)

(58) Field of Classification Search
CPC .... H10B 12/0335; H10B 12/05; H10B 12/31; H10B 12/315; H10B 12/482; H10B 12/488; H10B 53/30
See application file for complete search history.

(56) References Cited

U.S. PATENT DOCUMENTS

| | | | |
|---|---|---|---|
| 9,076,686 | B1 | 7/2015 | Karda et al. |
| 9,276,092 | B1 | 3/2016 | Karda et al. |
| 9,276,134 | B2 | 3/2016 | Karda et al. |
| 9,337,210 | B2 | 5/2016 | Karda et al. |
| 9,991,122 | B2 | 6/2018 | Meade et al. |
| 2002/0109173 | A1 | 8/2002 | Forbes et al. |
| 2004/0228168 | A1* | 11/2004 | Ferrant ............... H01L 27/1203 365/154 |
| 2012/0168843 | A1* | 7/2012 | Seo .................. H01L 27/10876 438/266 |
| 2015/0014700 | A1* | 1/2015 | Khalil ............... H01L 21/76895 438/285 |
| 2015/0108500 | A1* | 4/2015 | Irsigler ............... H01L 29/7786 257/77 |
| 2016/0268128 | A1* | 9/2016 | Cheng ............... H01L 21/02527 |
| 2018/0138182 | A1 | 5/2018 | Goswami et al. |
| 2019/0131410 | A1* | 5/2019 | Li ........................ H10K 10/00 |
| 2020/0066917 | A1 | 2/2020 | Kula et al. |
| 2020/0083230 | A1 | 3/2020 | Imamoto et al. |
| 2020/0340119 | A1* | 10/2020 | Mane ..................... C23C 16/56 |
| 2021/0050443 | A1 | 2/2021 | Karda et al. |
| 2021/0057424 | A1 | 2/2021 | Karda et al. |

OTHER PUBLICATIONS

Desai et al, "MoS2 Transistors with 1-Nanometer Gate Lengths", Science vol. 354, Issue 6308, Oct. 7, 2016, United States, pp. 99-102.

Novoselov et al., "Electric Field Effect in Atomically Thin Carbon Films", Science vol. 306, No. 5696, Oct. 22, 2004, United States, 5 pages.

Royal Swedish Academy of Sciences, "Graphene: Scientific Background on the Nobel Prize in Physics 2010", Kungl. Vetenskaps-Akademien, Oct. 5, 2010, Sweden, 10 pages.

* cited by examiner

INTEGRATED ASSEMBLIES AND METHODS OF FORMING INTEGRATED ASSEMBLIES

RELATED PATENT DATA

This application claims priority to and the benefit of U.S. Provisional Patent Application Ser. No. 63/072,033, filed Aug. 28, 2020, the disclosure of which is incorporated herein by reference.

TECHNICAL FIELD

Integrated assemblies (e.g., integrated memory). Methods of forming integrated assemblies.

BACKGROUND

Transistors are utilized in a variety of semiconductor devices. Field effect transistors (FETs) include a channel region between a pair of source/drain regions, and include one or more gates configured to electrically connect the source/drain regions to one another through the channel region.

Vertical FETs (VFETs) have channel regions that are generally perpendicular to a primary surface of a substrate on which the transistors are formed. Polycrystalline silicon is conventionally used as a material of the channel region in the transistors. Two-dimensional-materials have also been investigated for use as the channel material due to their large band gap and good mobility properties compared to polycrystalline silicon. It can be problematic to incorporate two-dimensional-materials into transistors.

It is desired to develop new methods for incorporating two-dimensional-materials into transistor devices. It is also desired to develop improved transistor device configurations utilizing two-dimensional-materials.

BRIEF DESCRIPTION OF THE DRAWINGS

FIGS. 1A-11A are diagrammatic cross-sectional side views along the lines A-A of FIGS. 1-11, respectively.

DETAILED DESCRIPTION OF THE ILLUSTRATED EMBODIMENTS

Some embodiments include vertical transistors (VFETs) having two-dimensional-material as the active material of the transistors. Some embodiments include methods of forming VFETs.

Figure 10:
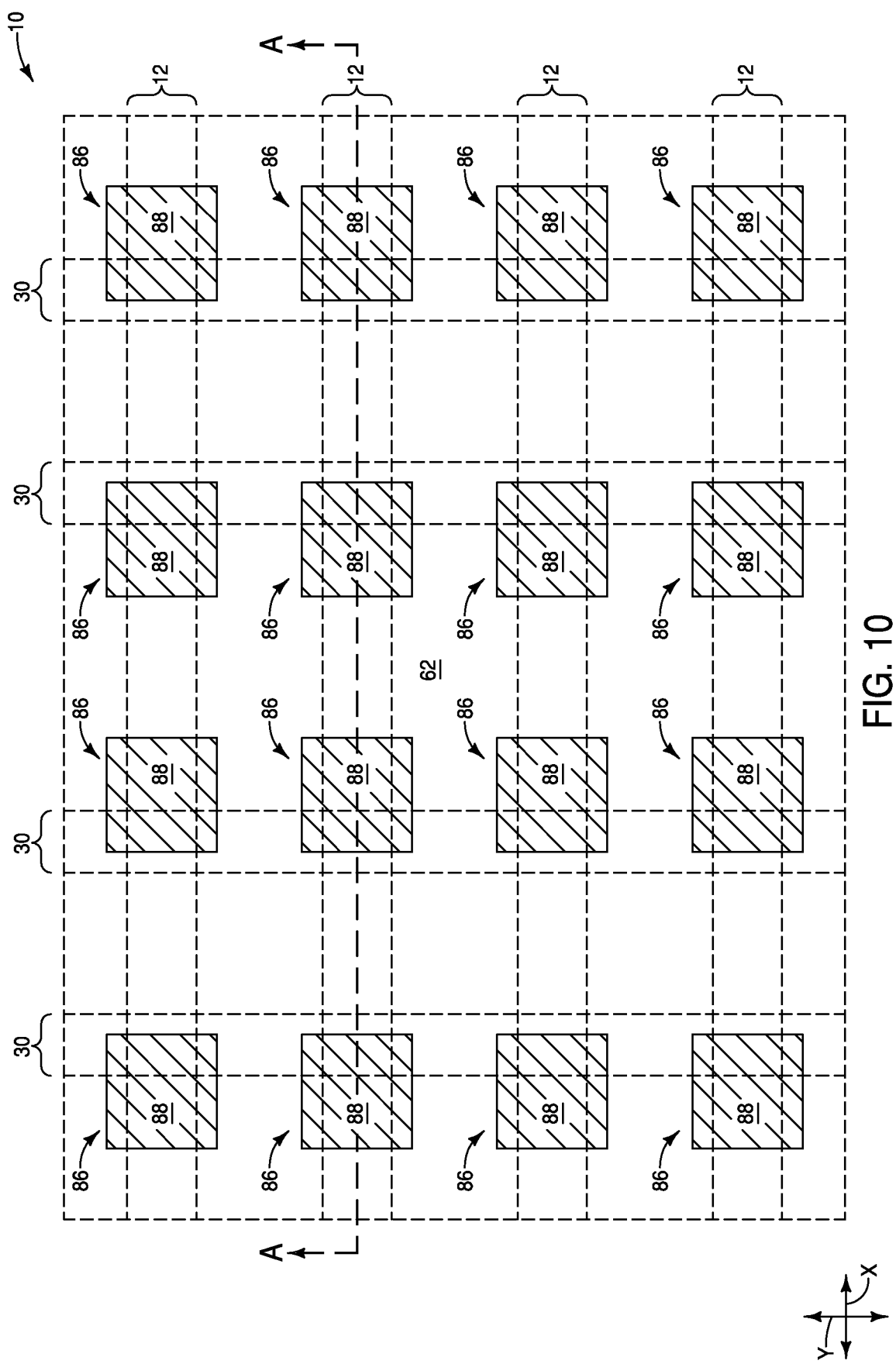
Figure 11:
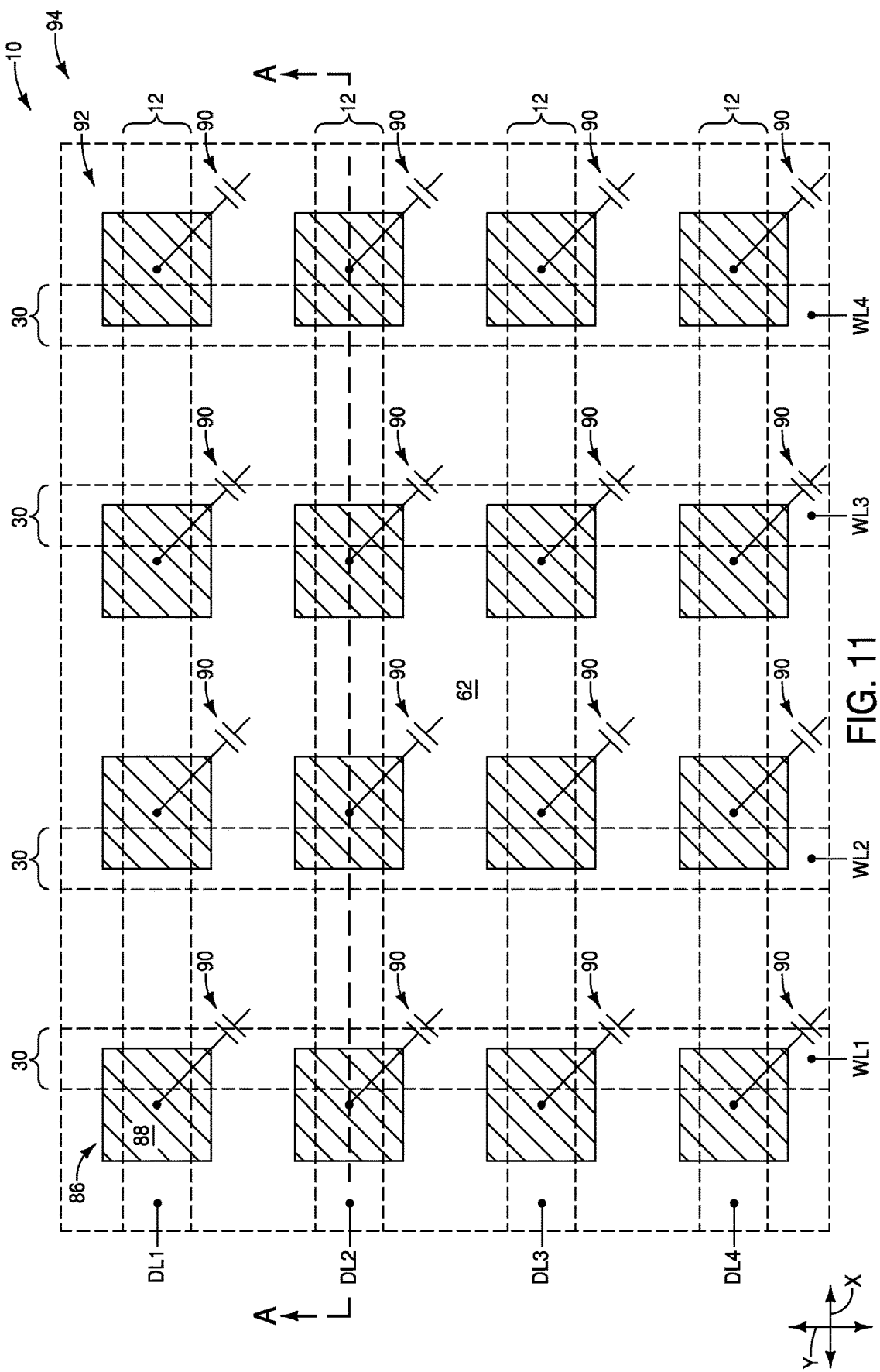

Example embodiments are described with reference to FIGS. 1-12. FIGS. 1-11 illustrate example process stages of an example method. FIGS. 10 and 11 illustrate example arrays comprising example VFETs, with FIG. 11 illustrating an example memory array comprising VFETs as access devices and comprising capacitors as storage elements coupled with source/drain regions of the access devices.

Figure 1:
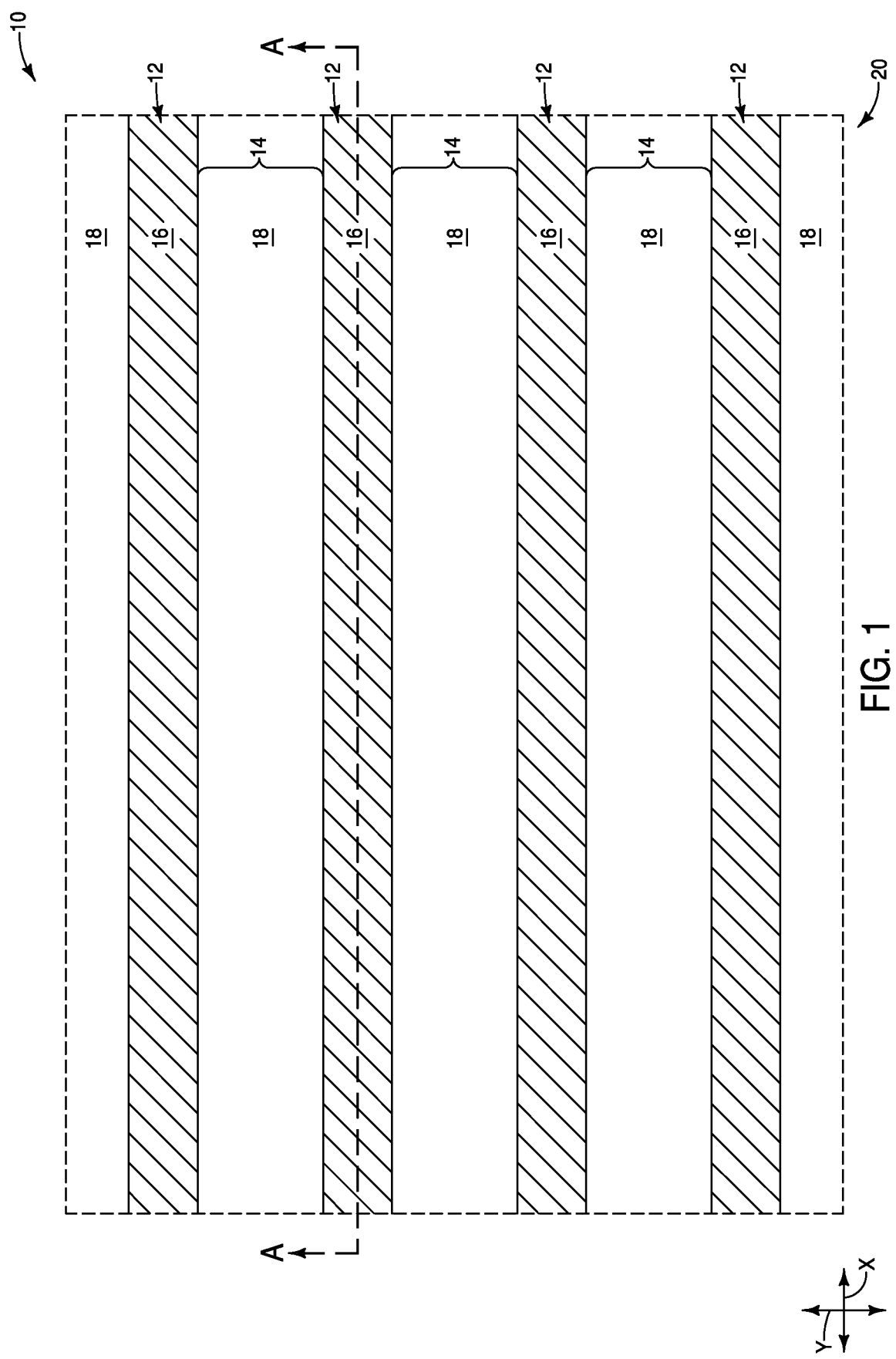
FIGS. 1-11 are diagrammatic top-down views of a region of an example integrated assembly at example sequential process stages of an example method.
Figure 1A:
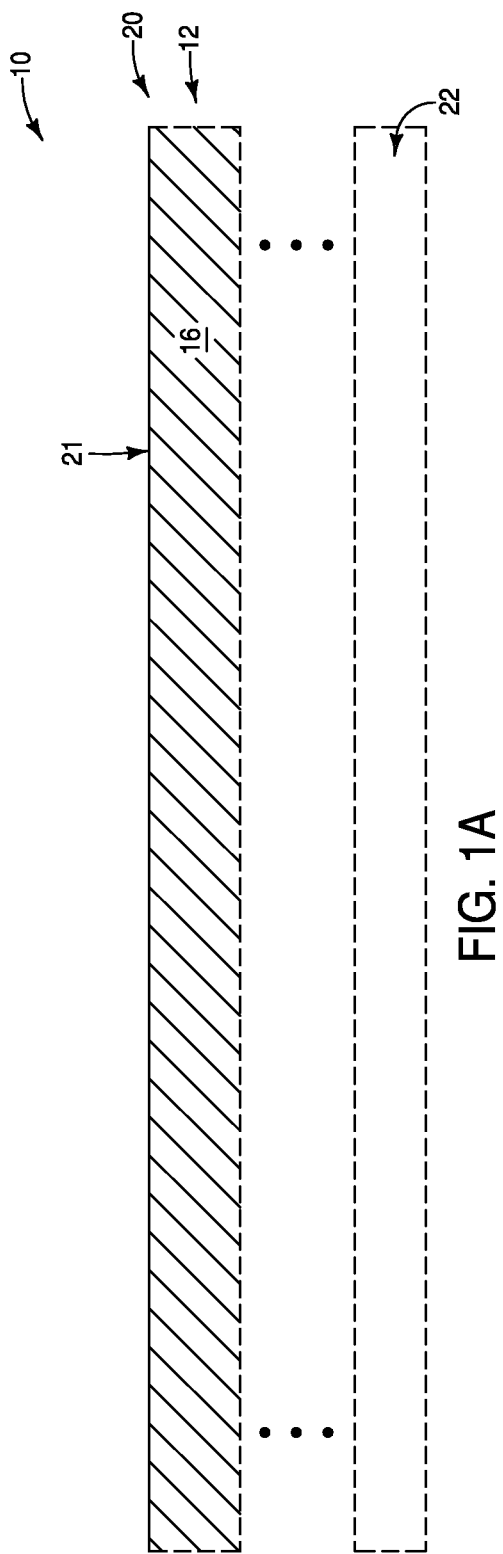

Referring to FIGS. 1 and 1A, an integrated assembly 10 includes first conductive structures 12 which extend along a first direction (an illustrated x-axis direction). The first conductive structures 12 are spaced from one another by insulative regions (intervening regions) 14. In some embodiments, the conductive structures 12 and the insulative regions 14 may be considered to alternate with one another along a second direction (an illustrated y-axis direction).

The conductive structures 12 comprise conductive material 16. The conductive material 16 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

In some embodiments, the conductive structures 12 may be conductive lines, and may correspond to digit lines (bitlines, sense lines, etc.). Although the conductive structures 12 are shown to extend substantially straight along the x-axis direction, it is to be understood that in other embodiments the conductive structures 12 may be curved, wavy, etc.

The intervening regions 14 comprise insulative material 18. The insulative material 18 may comprise any suitable composition(s), and in some embodiments may comprise, consist essentially of, or consist of silicon dioxide.

The structures 12 and insulative material 18 may be considered together to form a construction 20. The construction 20 has a horizontally-extending upper surface 21. Such upper surface may be a planarized upper surface. The planarized upper surface may be formed utilizing any suitable planarization process, including, for example, chemical-mechanical polishing (CMP).

The construction 20 is supported by a base 22. The base 22 may comprise semiconductor material; and may, for example, comprise, consist essentially of, or consist of monocrystalline silicon. The base 22 may be referred to as a semiconductor substrate. The term "semiconductor substrate" means any construction comprising semiconductive material, including, but not limited to, bulk semiconductive materials, such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 22 may correspond to a semiconductor substrate containing one or more materials associated with integrated circuit fabrication. Such materials may include, for example, one or more of refractory metal materials, barrier materials, diffusion materials, insulator materials, etc.

A gap is provided between the base 22 and the construction 20 to indicate that other materials, components, etc., may be provided between the base 22 and the construction 20 in some embodiments.

Figure 2:
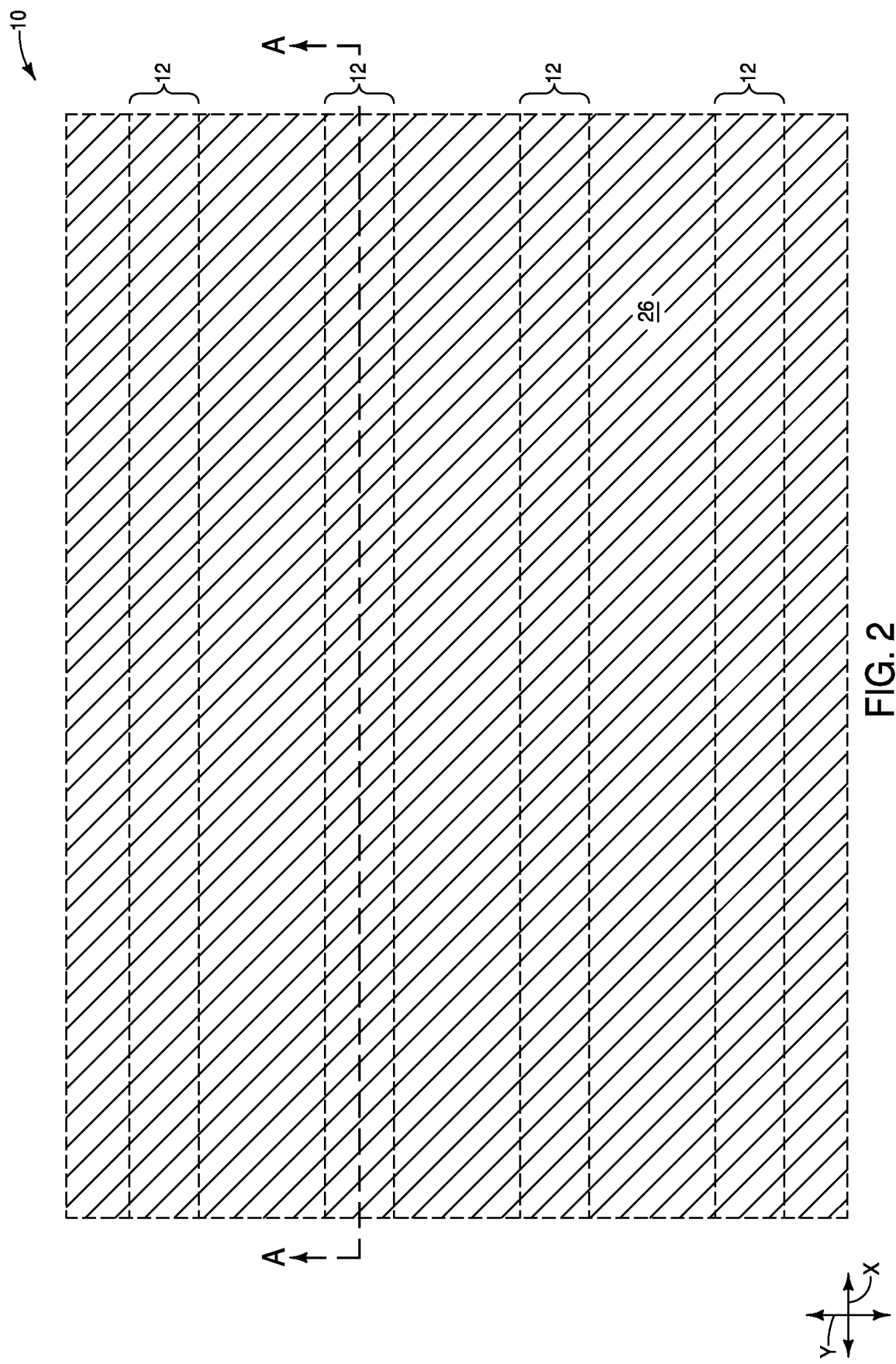
Figure 2A:
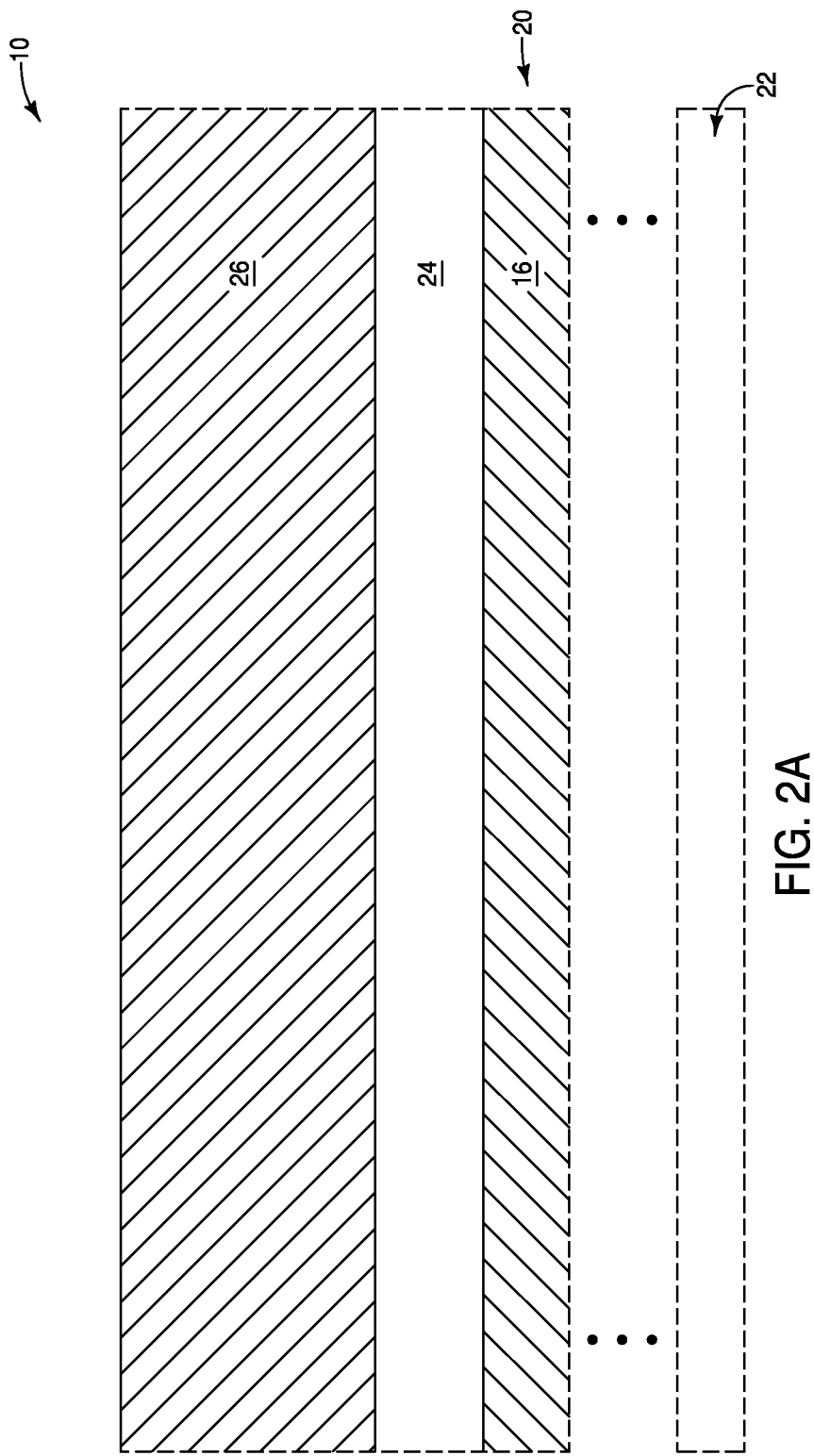

Referring to FIGS. 2 and 2A, insulative material 24 is formed over the construction 20, and conductive material 26 is formed over the insulative material 24. The conductive structures 12 are shown in dashed-line (phantom) view in the top-down illustration of FIG. 2 to indicate that such conductive structures are under other materials.

The insulative material 24 may comprise any suitable composition(s), and in some embodiments may comprise, consist essentially of, or consist of one or more of silicon dioxide, silicon nitride, aluminum oxide, hafnium oxide, etc. In some embodiments, the insulative material 24 may comprise one or more high-k compositions, with the term high-k meaning a dielectric constant greater than that of silicon dioxide (i.e., greater than about 3.9).

The insulative materials 18 (FIG. 1) and 24 may be the same composition as one another or may comprise different compositions relative to one another.

The conductive material 26 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive materials 16 and 26 may be the same composition as one another or may comprise different compositions relative to one another.

Figure 3:
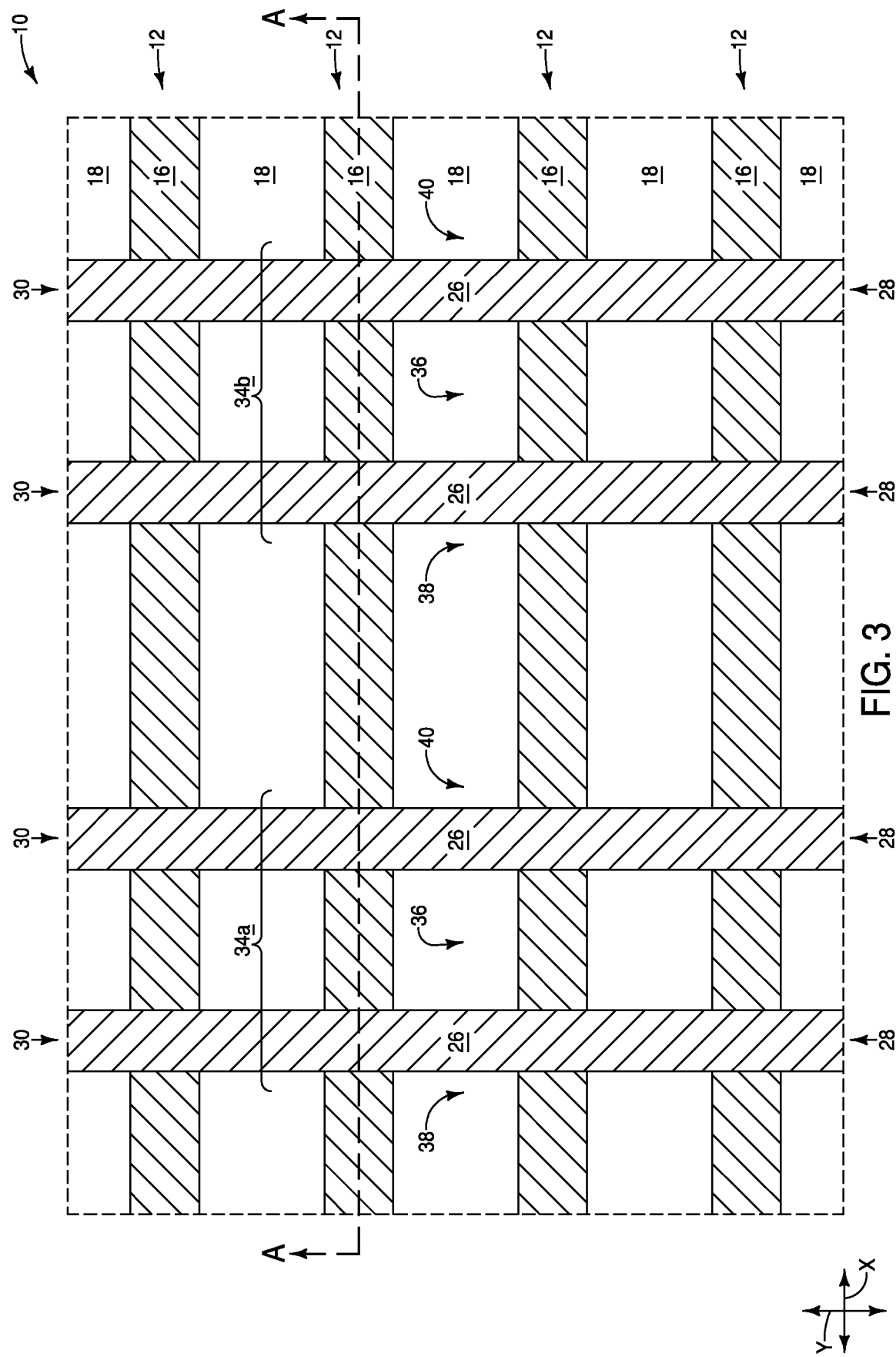
Figure 3A:
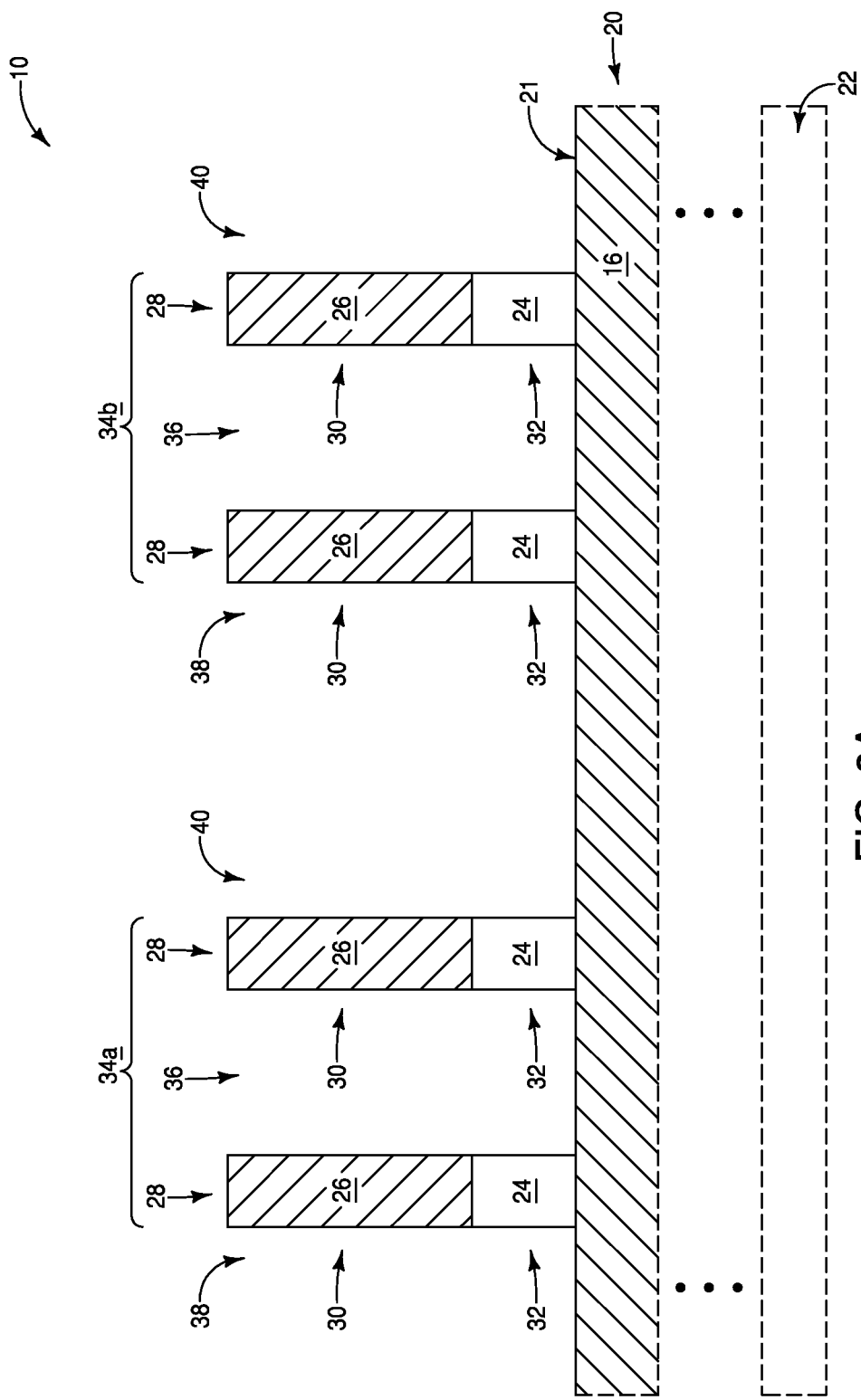

Referring to FIGS. 3 and 3A, the materials 24 and 26 are patterned into linear structures 28. The portions of the linear structures 28 corresponding to the conductive material 26 may be considered to be second conductive structures 30. The second conductive structures 30 extend along a second direction (the illustrated y-axis direction) which crosses the first direction (the illustrated x-axis direction) of the first conductive structures 12. The second conductive structures 30 may correspond to wordlines (access lines) in some embodiments.

The second conductive structures 30 are spaced from the construction 20 by intervening insulative regions 32 corresponding to the insulative material 24 of the linear structures 28. In some embodiments, the insulative regions 32 may be referred to as second insulative regions to distinguish them from the first insulative regions 14 described above with reference to FIG. 1.

The linear structures 28 may be referred to as upwardly-extending structures, and in some embodiments may be referred to as fins, rails, beams, etc. The upwardly-extending structures 28 extend along an illustrated z-axis direction, and accordingly extend orthogonally (or at least substantially orthogonally) relative to the horizontally-extending upper surface 21 of the construction 20. The term "substantially orthogonally" means orthogonally to within reasonable tolerances of fabrication and measurement.

The upwardly-extending structures 28 may be considered to extend vertically, or at least substantially vertically. In some embodiments, the structures 28 may extend at an angle of about 90° (i.e., 90°±10° relative to the horizontally-extending surface 21.

The second conductive structures 30 may be considered to be arranged in pairs, with the paired arrangements being identified as 34a and 34b in FIGS. 3 and 3A. Each of the paired arrangements may be considered to have an inner region 36 between the paired conductive structures 30, and to have outer regions 38 and 40 outward of the conductive structures of the paired arrangements. Each of the outer regions 38 may be referred to as a first outer region, and is on opposing side of one of the paired conductive structures 30 from the inner region 36; and each of the outer regions 40 may be referred to as a second outer region, and is on opposing sides of the other of the paired conductive structures 30 from the inner region 36.

Figure 4:
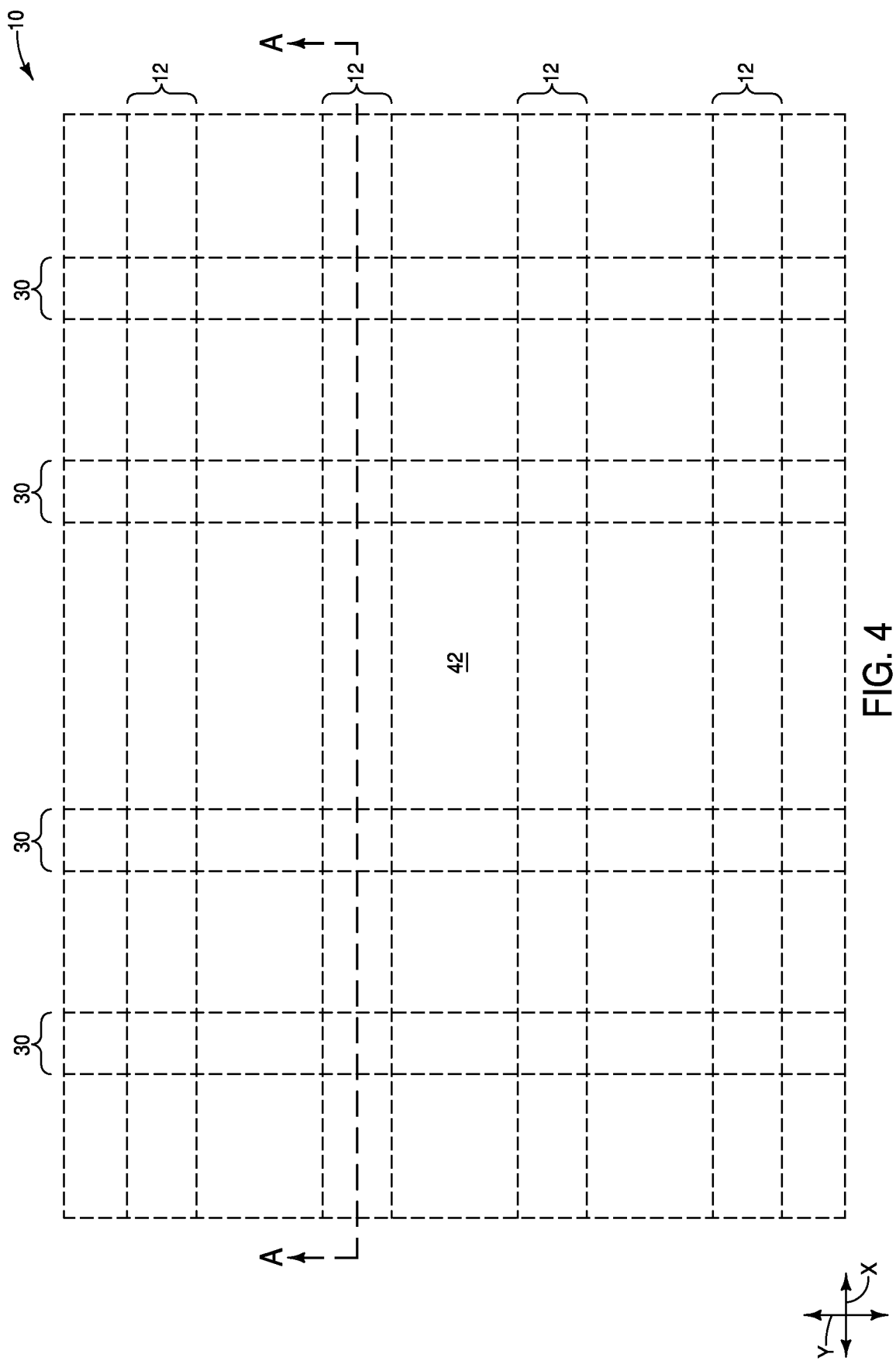
Figure 4A:
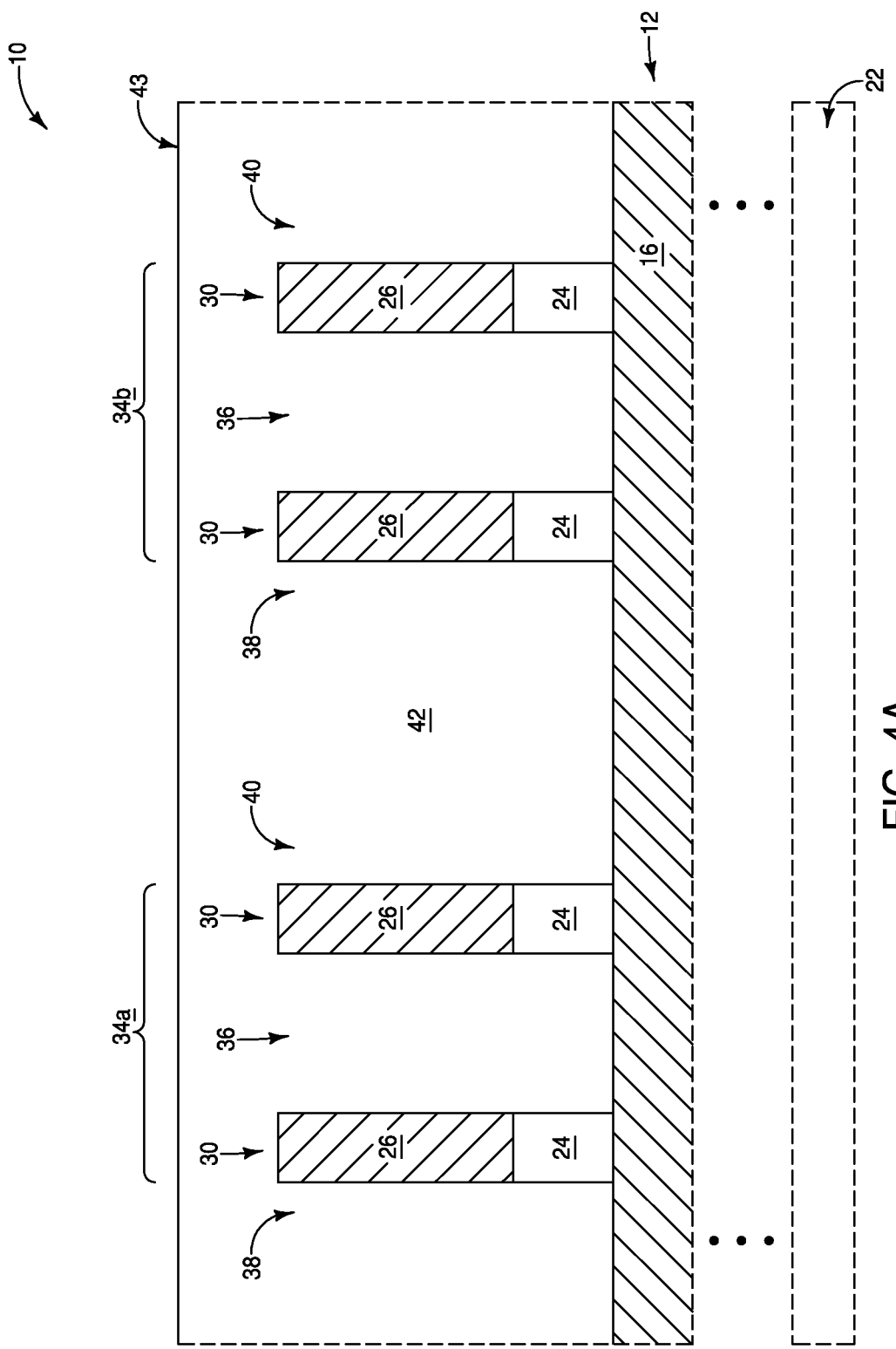
Figure 4A:
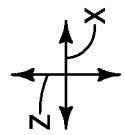

Referring to FIGS. 4 and 4A, insulative material 42 is formed over the conductive structures 30. The insulative material 42 may comprise any suitable composition(s), and in some embodiments may comprise, consist essentially of, or consist of one or more of silicon dioxide, silicon nitride, aluminum oxide, hafnium oxide, zirconium oxide, etc. The insulative material 42 may or may not be a same composition as the insulative material 24.

In the illustrated embodiment, a planarized surface 43 is formed over the insulative material 42. The planarized surface 43 may be formed with any suitable process, including, for example, CMP.

Figure 5:
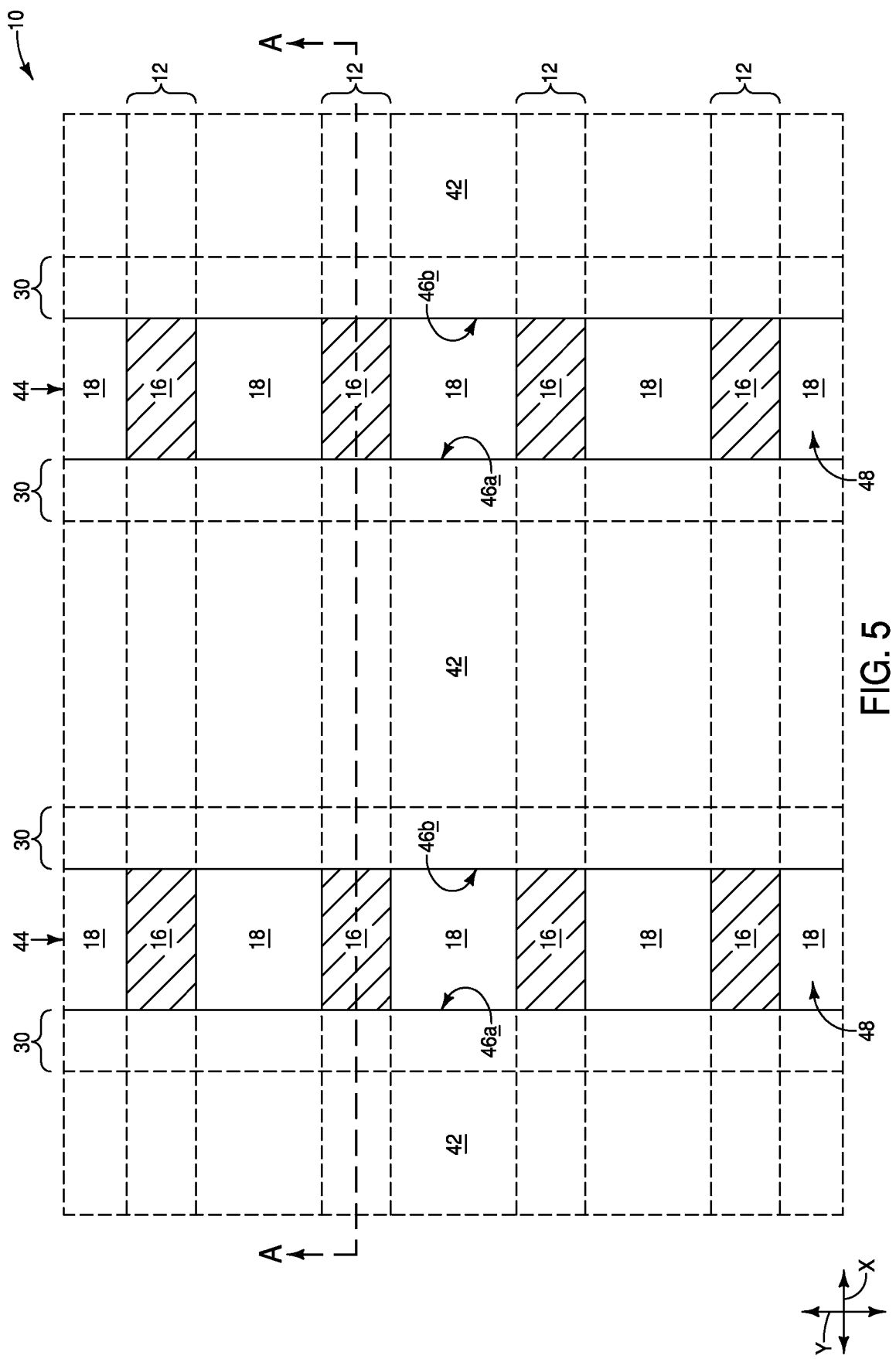
Figure 5A:
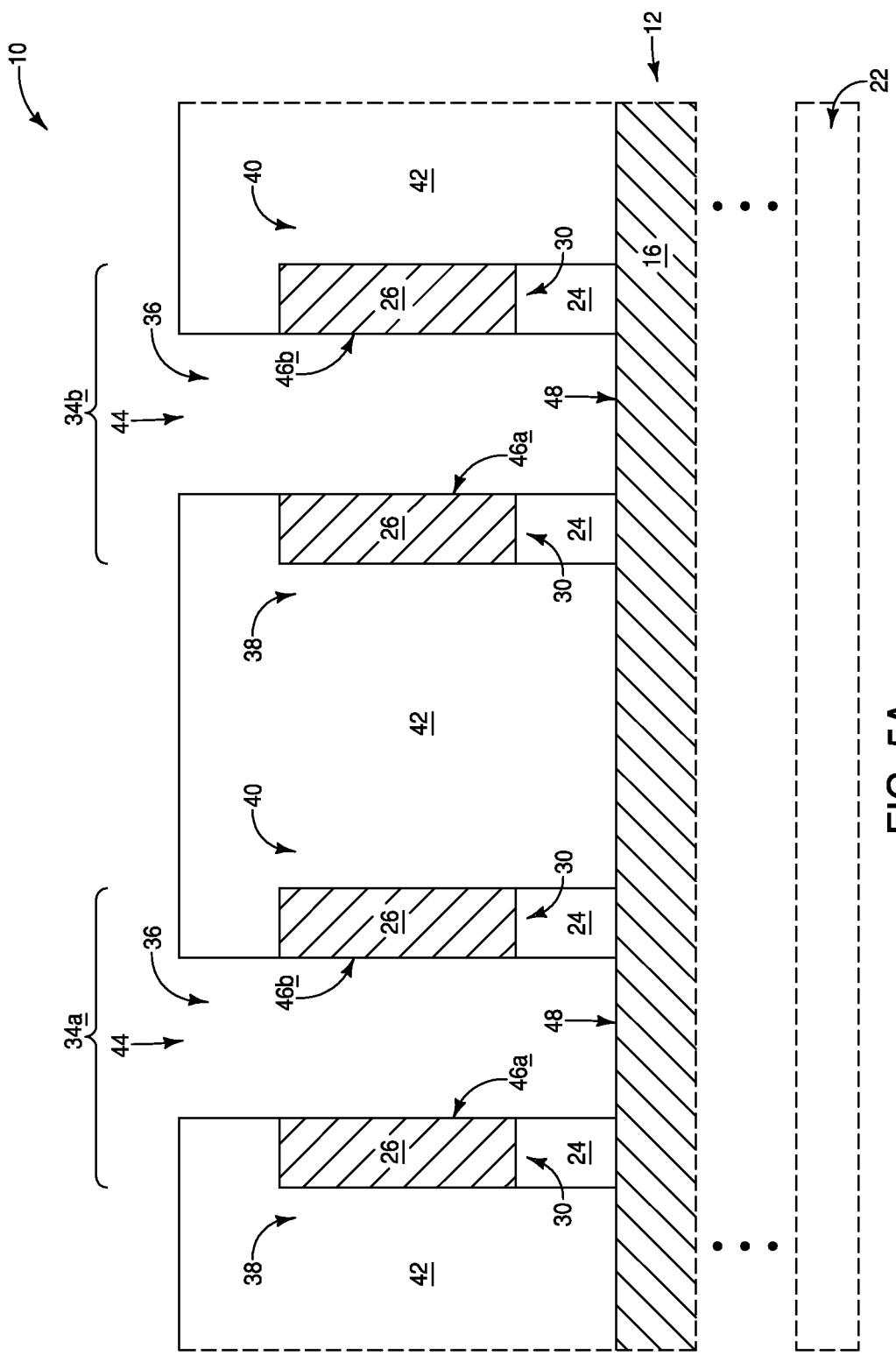

Referring to FIGS. 5 and 5A, trenches 44 are formed to extend through the insulative material 42. The trenches extend through the inner regions 36 of the paired arrangements 34, and in the shown embodiment extend to the conductive material 16 of the conductive structures 12. The trenches may penetrate into the conductive material 16, or may stop at an upper surface of the conductive material 16 (as shown).

Each of the trenches 44 has a first sidewall surface 46a along one side of the trench, and has a second sidewall surface 46b along an opposing sides of the trench. The sidewall surfaces 46a and 46b may be referred to as first and second opposing surfaces, respectively. Each of the trenches also has a bottom surface 48 which extends between the sidewall surfaces 46a and 46b. The bottom surfaces 48 are along the conductive material 16 of the first conductive lines (digit lines) 12, and are along the insulative material 18 between the conductive lines 12.

In the illustrated embodiment, conductive material 26 of the second conductive structures (wordlines) 30 is exposed along the sidewall surfaces 46a and 46b.

Figure 6:
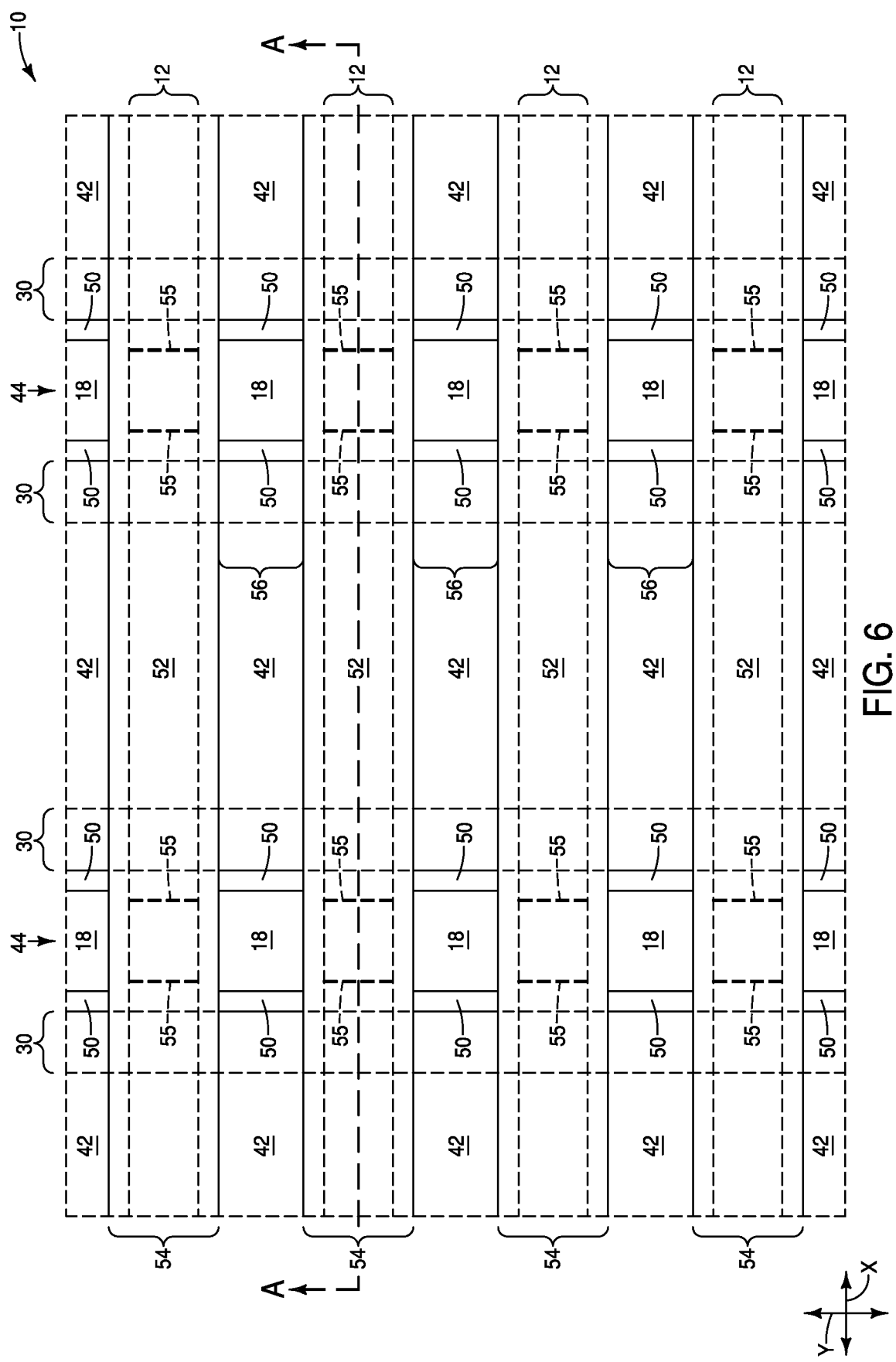
Figure 6A:
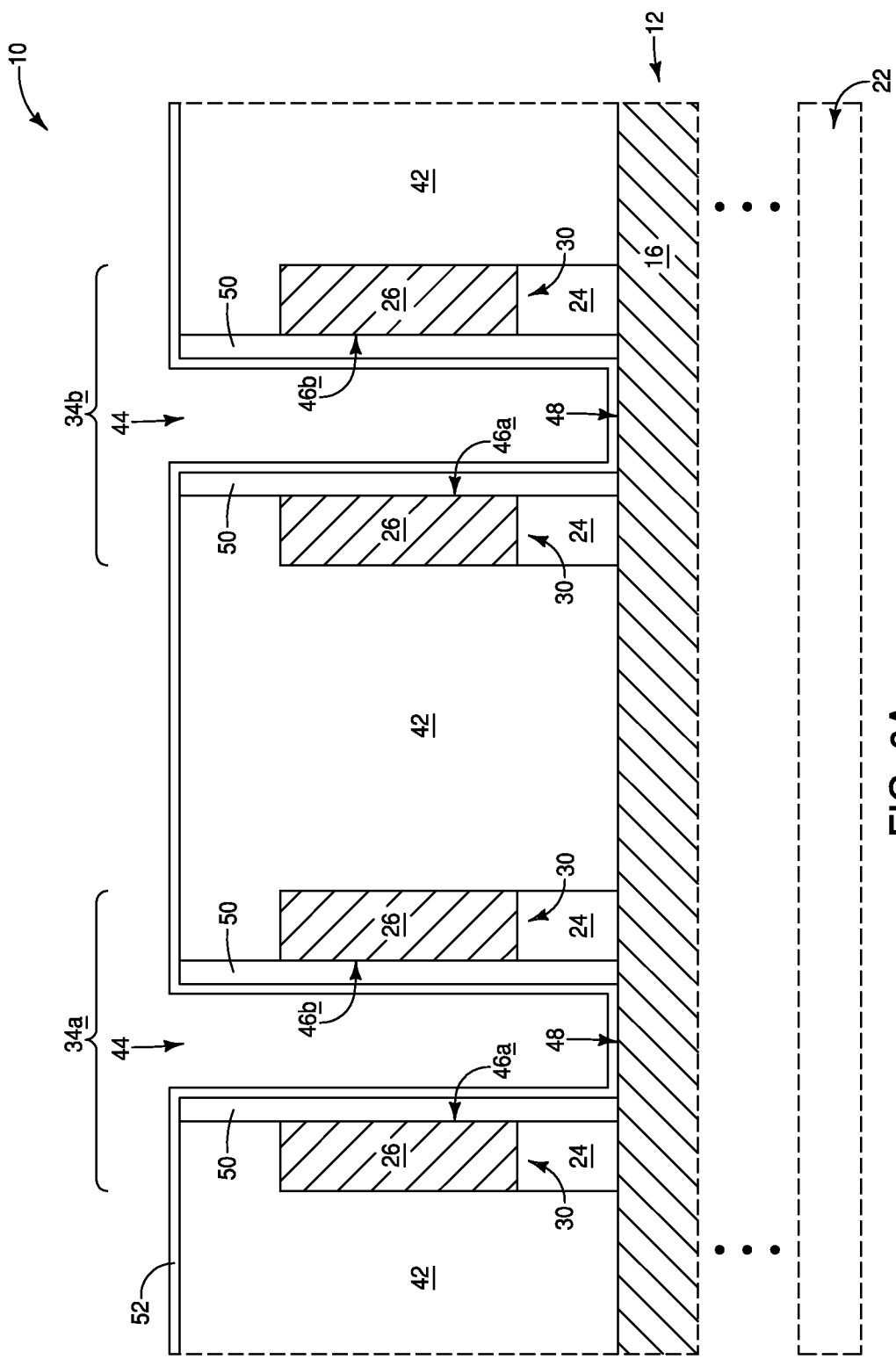

Referring to FIGS. 6 and 6A, dielectric material (insulative material) 50 is formed along the sidewall surfaces 46a and 46b to narrow the trenches 44. The dielectric material 50 may be utilized as gate-dielectric-material of transistor devices, and may comprise any suitable composition(s). In some embodiments, the dielectric material 50 may comprise one or more of silicon dioxide, silicon nitride, aluminum oxide, hafnium oxide, etc. The dielectric material 50 may be formed to any suitable lateral thickness, and in some embodiments may be formed to a lateral thickness within a range of from about 2 nm to about 10 nm.

Two-dimensional-material 52 is formed to extend substantially conformally along the insulative material 42 and the dielectric material 52, and to extend into the trenches 44. The term "substantially conformally" means conformally to within reasonable tolerances of fabrication and measurement. In the illustrated embodiment, the two-dimensional-material 52 directly contacts the conductive material 16 of the conductive structures 12 at the bottoms of the trenches 44.

The two-dimensional-material 52 is configured as strips (ribbons, spaced-apart linear structures) 54, as can be understood with reference to the top-down view of FIG. 6. The strips 54 are aligned with the digit lines 12 (shown in phantom view in FIG. 6), and are directly over such digit lines. The strips 54 extend along the same direction as the digit lines 12 (i.e., the illustrated x-axis direction).

The strips 54 are spaced from one another by intervening regions 56. The insulative materials 42, 50 and 18 are exposed within such intervening regions.

Dashed-lines 55 are provided within the top-down view of FIG. 6 to assist the reader in visualizing upper corners of the trenches 44 along the strips 54 of the two-dimensional-material 52.

The two-dimensional-material 52 may be formed with any suitable processing, including, for example, one or more of atomic layer deposition (ALD), chemical vapor deposition (CVD), physical vapor deposition (PVD), etc.

The term "two-dimensional-material" refers to a material having one or more layers with stronger forces within each layer (ionic, covalent, etc.) than along edges of the layers (e.g., between adjacent layers). The forces along edges of the layers (e.g., between adjacent layers) will generally be predominantly van der Waals forces. The two-dimensional-material 52 may comprise any suitable number of layers; and in some embodiments may comprise a stack having 1 to 10 separate layers. The two-dimensional-material 52 may have any suitable thickness, and in some embodiments may have a thickness within a range of from about 0.5 nm to about 5 nm.

The two-dimensional-material 52 may comprise any suitable composition(s); and in some embodiments may comprise one or more of carbon, boron, germanium, silicon, tin, phosphorus, bismuth, indium, molybdenum, platinum, rhenium, tungsten and hafnium. In some embodiments, the two-dimensional-material 52 may comprise one or more of graphene, graphyne, borophene, germanene, silicene, $Si_2BN$, stanene, phosphorene, bismuthene, molybdenum disulfide, molybdenum diselenide, tungsten disulfide, tungsten diselenide, tin disulfide, rhenium disulfide, indium disulfide, and hafnium disulfide. In some embodiments, the two-dimensional-material 52 may comprise transition metal dichalcogenide (TMDC). The TMDC has the chemical formula MX, such as $MX_2$, where M is a transition metal and X is a chalcogen (e.g., sulfur, selenium, tellurium, etc.). The transition metal may include, but is not limited to, molybdenum, tungsten, niobium, zirconium, hafnium, rhenium, platinum, titanium, tantalum, vanadium, cobalt, cadmium, chromium, etc.

The two-dimensional-material 52 may be entirely monocrystalline, or may be at least substantially entirely monocrystalline. The term "substantially entirely monocrystalline" means that the material is greater than or equal to about 95% monocrystalline, by volume.

Figure 7:
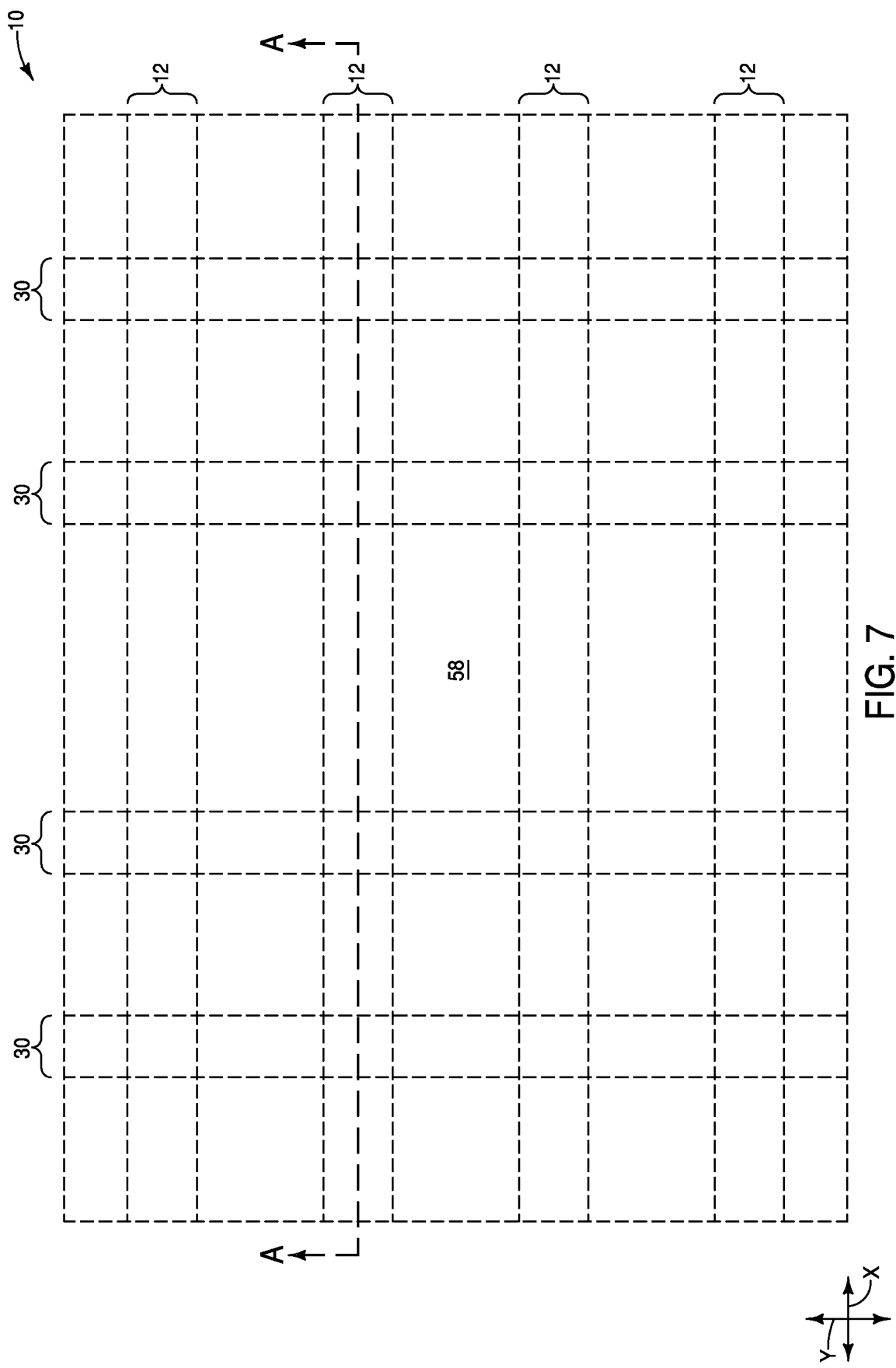
Figure 7A:
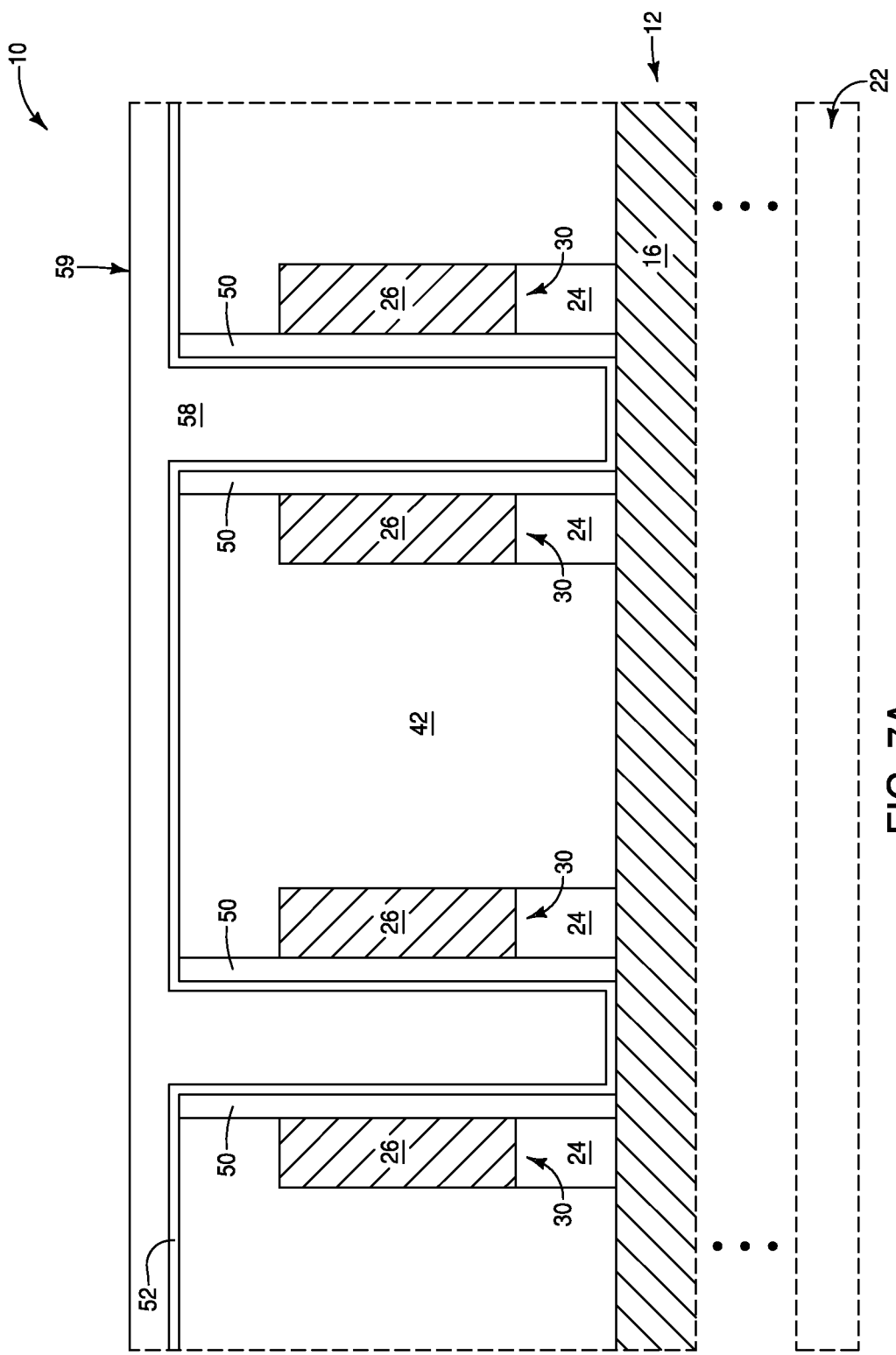

Referring to FIGS. 7 and 7A, insulative material 58 is provided over the two-dimensional material 52 and within the trenches 44 (FIGS. 6 and 6A). The insulative material 58 fills the trenches 44. In the illustrated embodiment, a planarized surface 59 is formed over the insulative material 58. The planarized surface 59 may be formed with any suitable process, including, for example, CMP.

The insulative material 58 may comprise any suitable composition(s), and in some embodiments may comprise one or more of hafnium oxide, aluminum oxide, zirconium oxide, etc. The material 58 may, for example, comprise a same composition as the gate-dielectric material 50 and/or as the insulative material 42.

Figure 8:
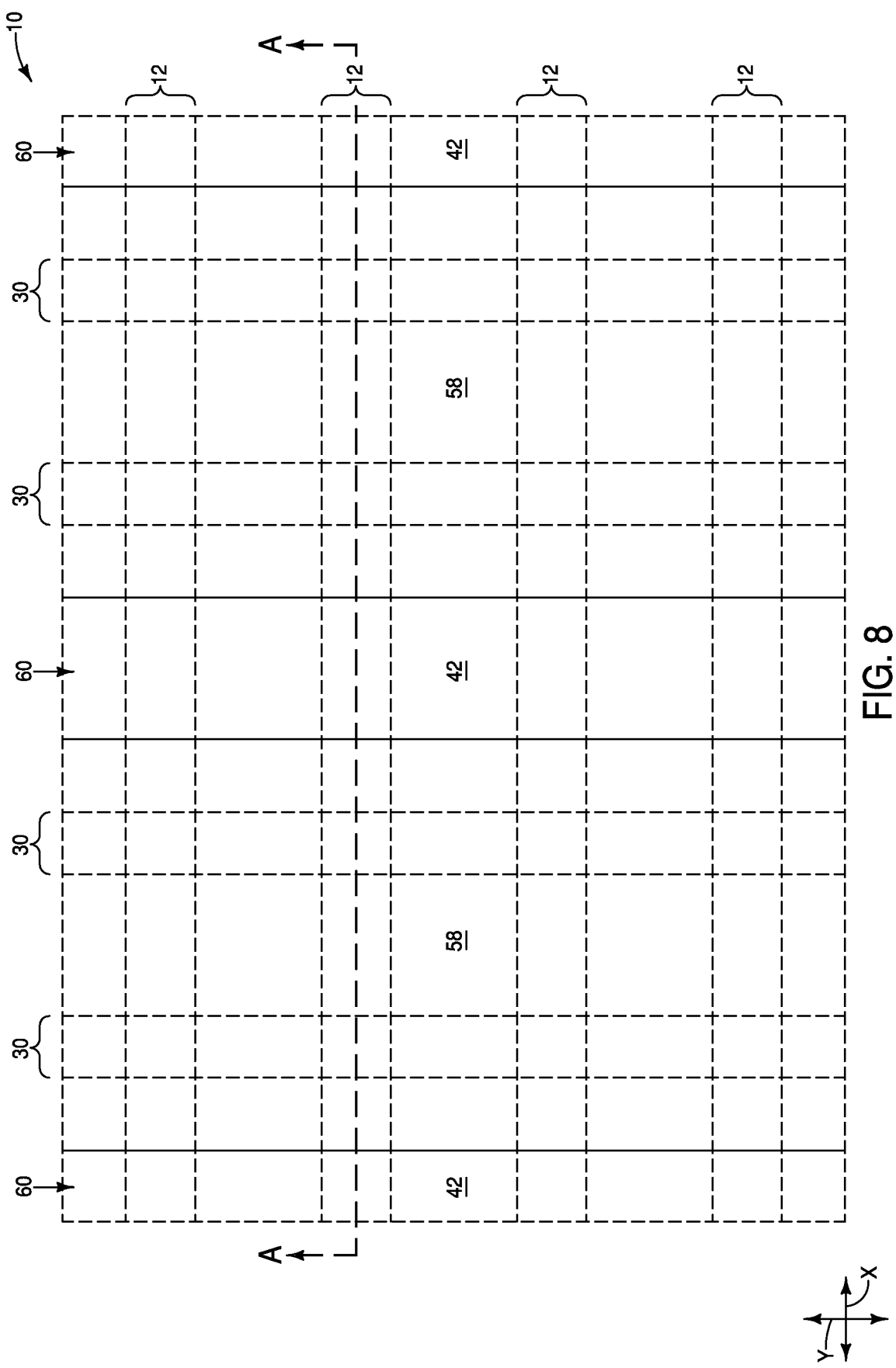
Figure 8A:
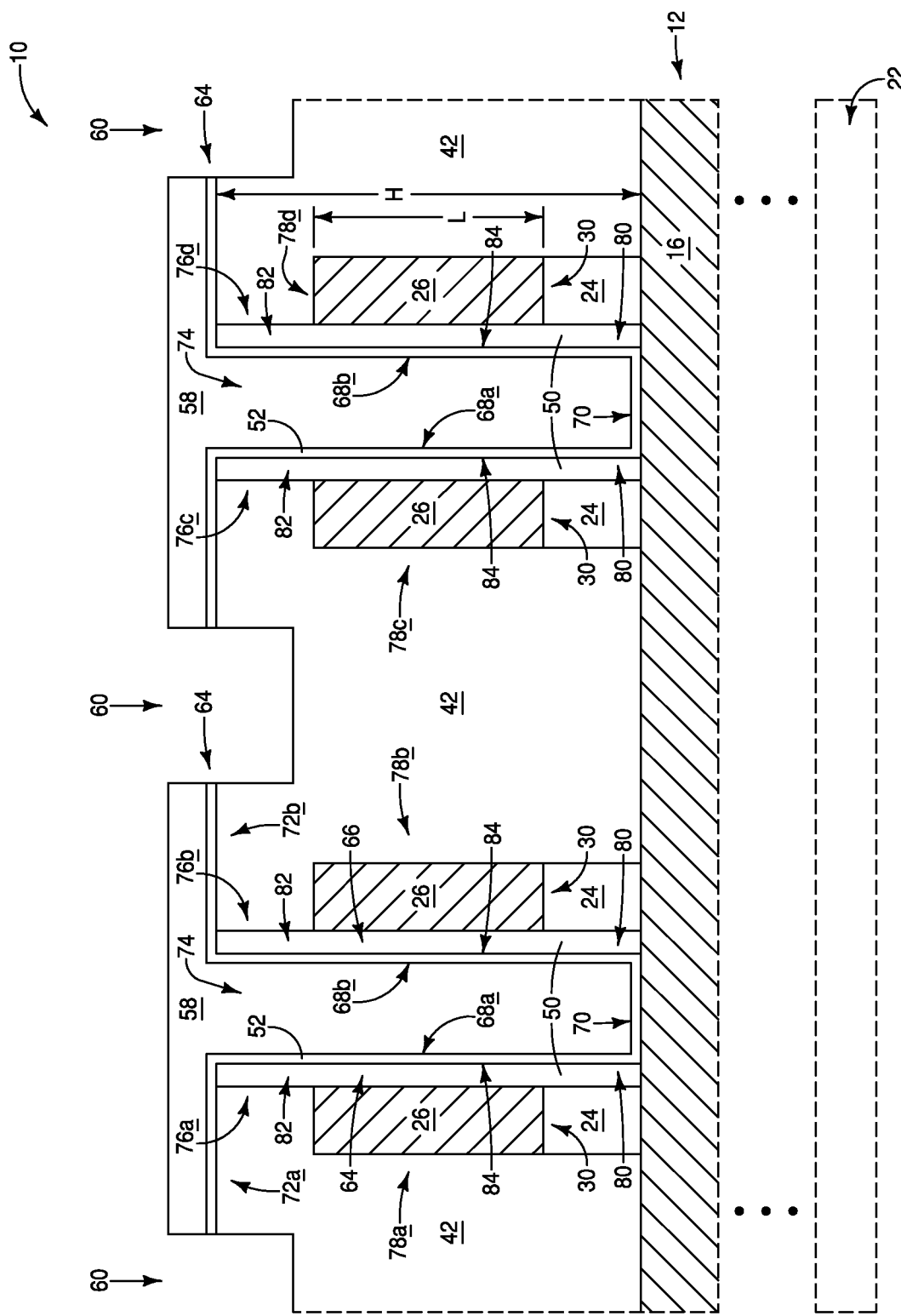

Referring to FIGS. 8 and 8A, trenches 60 are formed to extend through the materials 52 and 58, and in the shown embodiment such trenches extend into the material 42. The trenches 60 may be patterned with any suitable processing. For instance, a photolithographically-patterned photoresist mask may be utilized to define locations of the trenches, one or more etches may be utilized to make the trenches, and then the mask may be removed to leave the configuration of FIGS. 8 and 8A.

The trenches 60 pattern the strips 54 (FIG. 6) of the two-dimensional material 52 into segments 64. The trenches 60 may be formed to any suitable depth which patterns the two-dimensional material 52 into the segments 64. The trenches may extend partially into the material 42 (as shown), entirely through the material 42 to the digit lines 12 and the insulative material 18, or may stop at an upper surface of the material 42.

Each of the segments 64 includes an upwardly-opening container-shaped structure 66, with such container-shaped structure extending into one of the trenches 44 described above with reference to FIGS. 5 and 5A. The container-shaped structures 66 each include a pair of sidewall regions 68a and 68b, and each include a bottom region 70 extending between the sidewall regions 68a and 68b.

Each of the segments 64 includes an interior region 74, and includes ledge regions 72a and 72b projecting laterally outward from the interior region. In some embodiments, the ledge regions 72a and 72b may be referred to as a first ledge region and a second ledge region, respectively. The first ledge region 72a is over the first sidewall region 68a and projects laterally outward from such first sidewall region, and the second ledge region 72b is over the second sidewall region 68b and projects laterally outward from such second sidewall region.

The segments 64 are incorporated into transistors 76 (VFETS in the shown embodiment). The transistors are labeled 76a-76d to assist the reader in identifying the individual transistors. Each of the transistors comprises the two-dimensional material 52 within one of the sidewall regions 68 of a segment 64, and comprises a gating structure 78 adjacent the sidewall region 68. The gating structures within the transistors 76a-76d are labeled 78a-78d, respectively. Each of the gating structures comprises a region of a wordline 30.

The sidewall regions 68a and 68b are incorporated into active regions of the transistors 76a-76d. The sidewall regions may have lower source/drain regions 80, upper source/drain regions 82, and channel regions 84 vertically between the upper and lower source/drain regions. The source/drain regions 80 and 82 may be tailored (e.g., doped) to achieve desired p-type behavior or n-type to behavior, and the channel regions 84 may be tailored (e.g., doped) to achieve a desired threshold voltage. Suitable dopant(s) may include one or more of niobium, rhenium and chlorine. The tailoring of the regions 80, 82 and 84 may be conducted at any suitable process stage(es). For instance, at least some of such tailoring may occur in situ during the deposition of the material 52 at the process stage of FIG. 6. As another example, at least some of such tailoring may occur by implanting one or more dopants at a process stage subsequent to the deposition of the material 52. Additionally, the tailoring may involve activation of modified regions of the material 52 with a thermally-induced anneal and/or other suitable processing to activate the dopants.

The upper and lower source/drain regions 80 and 82 may be about the same size (same vertical height) as one another, and accordingly the transistors 76 may be symmetric devices. Alternatively, the source/drain regions 80 and 82 may be different sizes (different vertical heights) relative to one another, and accordingly the transistors 76 may be asymmetric devices.

The bottom regions 70 of the container-shaped structures 66 may be conductively doped so that the lower source/drain regions 80 along the sidewall regions 68a and 68b are together a common node that is electrically coupled with the digit line 12.

In some embodiments, the gating structures 78a-78d may be considered to be operatively adjacent to (operatively proximate to) the channel regions 84 such that a sufficient voltage applied to a gating structure will induce an electric field which enables current flow through an adjacent channel region 84 to electrically couple the source/drain regions 80 and 82 on opposing sides of the channel region with one another. If the voltage to the gating structure is below a threshold level, the current will not flow through the channel region, and the source/drain regions on opposing sides of the channel region will not be electrically coupled with one another. The selective control of the coupling/decoupling of the source/drain regions through the level of voltage applied to the gating structure may be referred to as gated coupling of the source/drain regions. The wordlines 30 may be coupled with drivers (described below with reference to FIG. 12) which are utilized to selectively provide desired voltage to the gating structures 78.

In some embodiments, the dielectric material 50 along the sidewall region 68a of a container-shaped structure 66 may be referred to as first insulative material, and the dielectric material 50 along the other sidewall region 68b of the container-shaped structure may be referred to as second insulative material. The first and second insulative materials are on opposing sides of the sidewall regions (68a and 68b) relative to the interior region 74 of the container-shaped structure 66. The gating structure adjacent the first insulative material may be referred to as a first gating structure (e.g., the gating structure 78a may be referred to as a first gating structure) and the gating structure adjacent the second insulative material may be referred to as a second gating structure (e.g., the gating structure 78b may be referred to as a second gating structure).

An advantage of the utilization of the two-dimensional material as the channel material of the transistors 76 is that such may enable the channel lengths to be kept short while still enabling suitable operational control of a channel region with an adjacent gating structure 68. In some embodiments, the transistors 76 may have an overall height, H, within a range of from about 10 nm to about 100 nm, and the gating structures 78 may have a length, L, within a range of from about 5 nm to about 50 nm. The channel length may be approximately the same as the length, L, of the gating structures.

In some embodiments, the transistors 76 may be formed with processing having reasonably low critical dimensions since the transistors may be kept relatively short as compared to conventional transistors. It is generally easier and cheaper to fabricate structures with low critical dimensions as compared to structures with higher critical dimensions.

The thin material 52 of the channel regions may enable good electrostatic control of the channel regions. Such may enable good electrostatic coupling between a gating region 78 and a channel region operatively proximate the gating region, and may enable problematic interactions from distant wordlines (so-called cross-talk) to be avoided, or even entirely eliminated.

Figure 9:
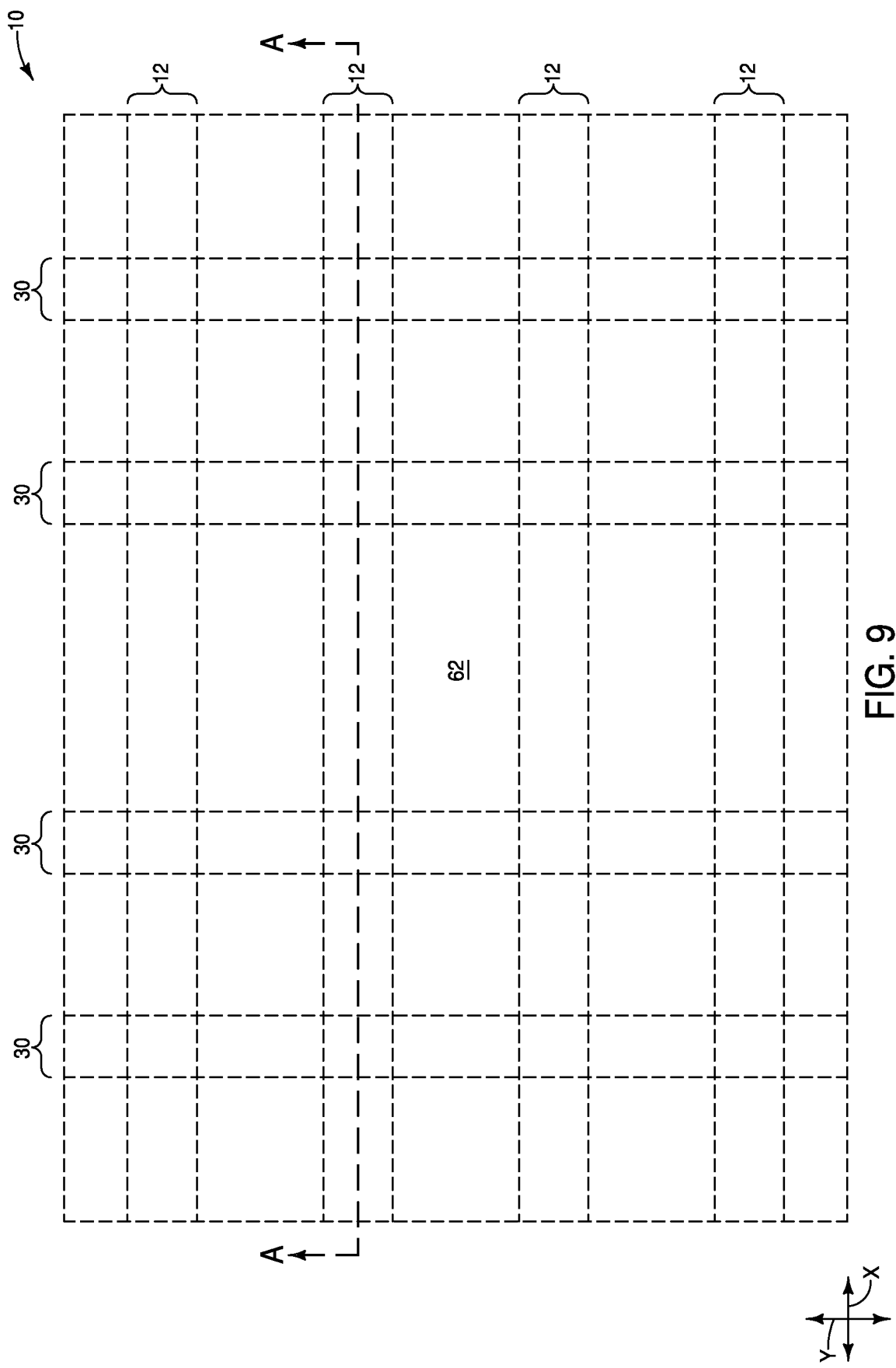
Figure 9A:
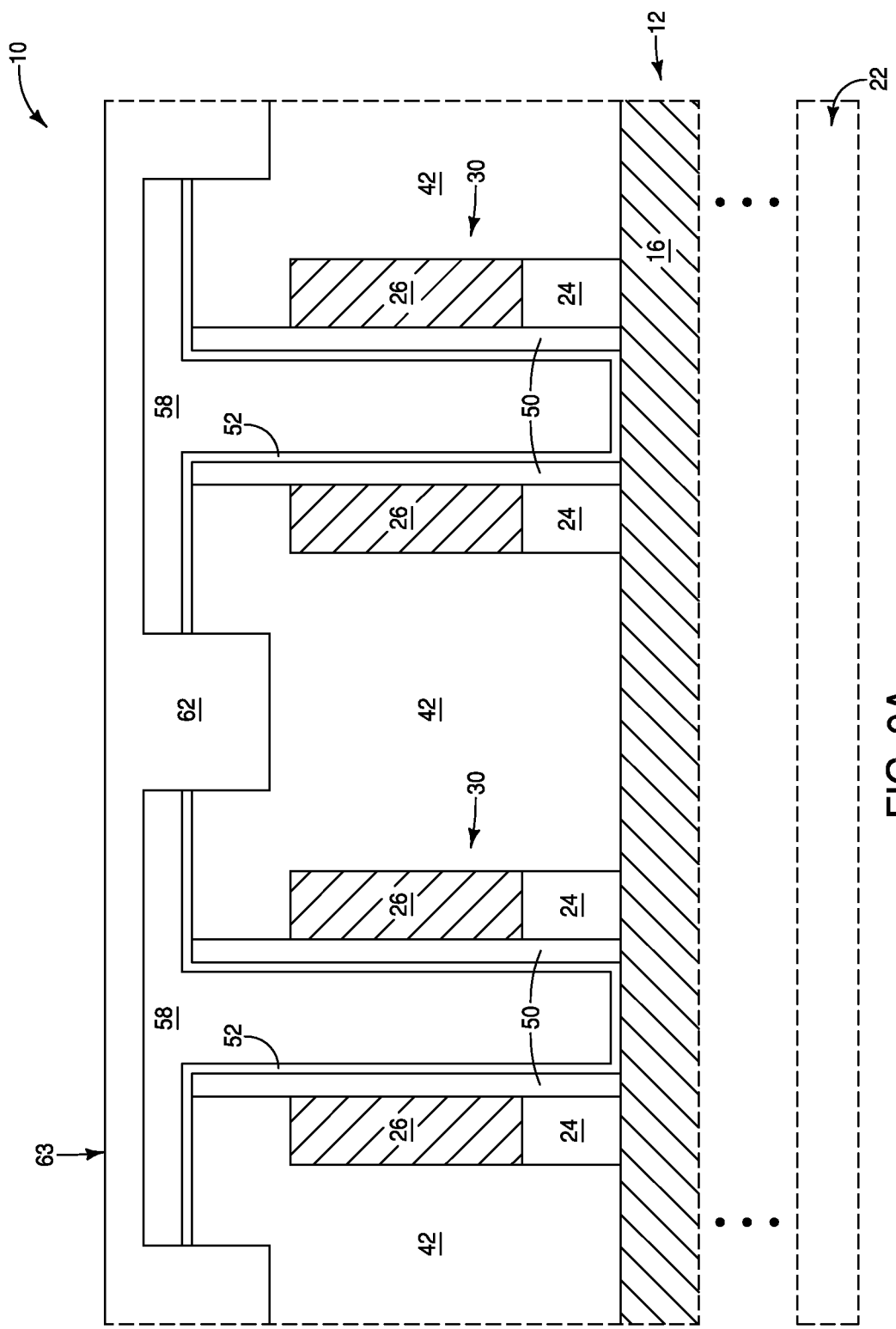

Referring to FIGS. 9 and 9A, an insulative material 62 is formed over the insulative material 58 and within the trenches 60. The insulative 62 may comprise any suitable composition(s), and in some embodiments may comprise, consist essentially of, or consist of one or more of silicon dioxide, silicon nitride, aluminum oxide, hafnium oxide, zirconium oxide, etc. In some embodiments, the material 62 may comprise a same composition as the material 42. A planarized surface 63 may be formed across the material 62. The planarized surface may be formed with any suitable processing, including, for example, CMP.

Figure 10A:
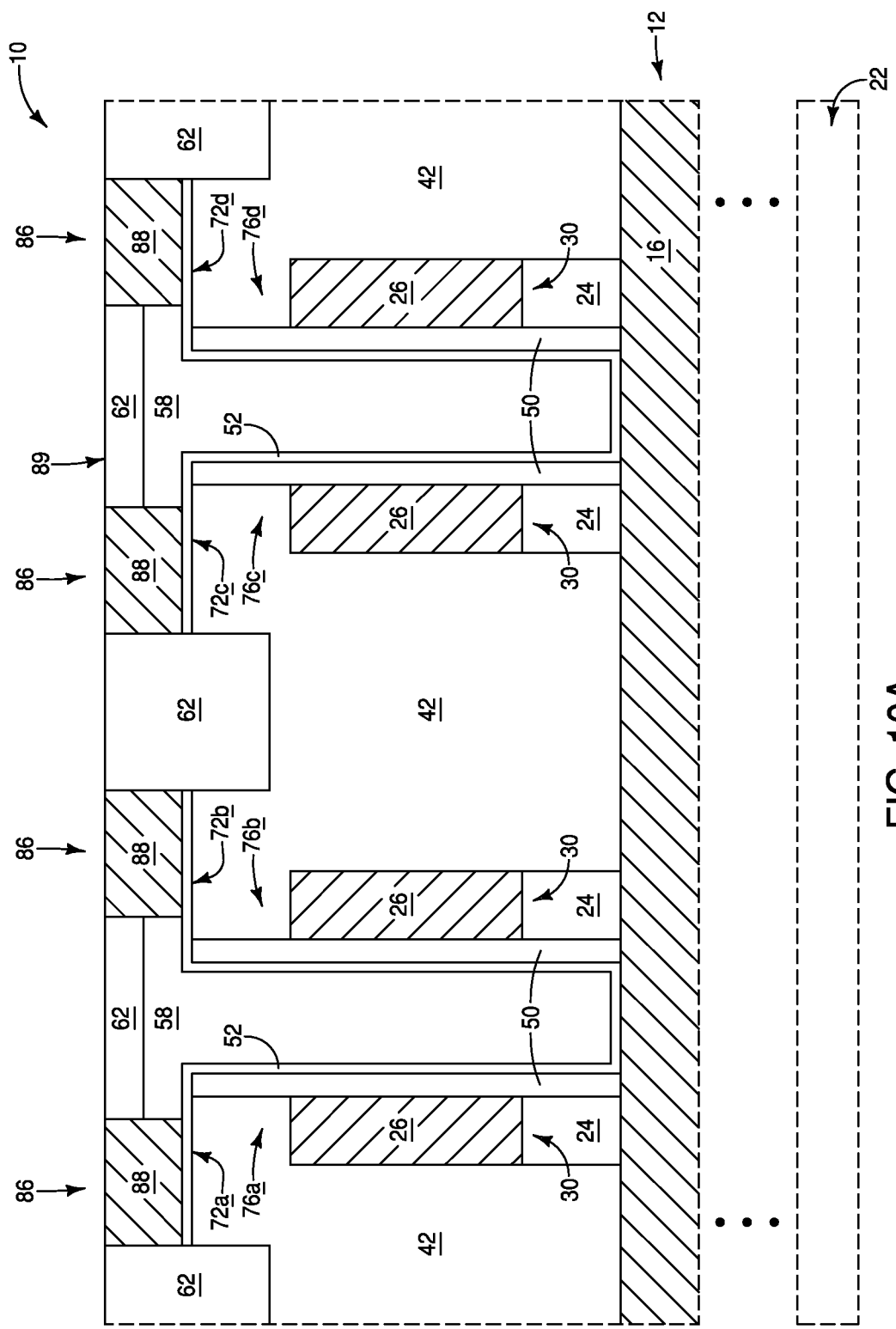

Referring to FIGS. 10 and 10A, conductive structures 86 are formed over the ledges 72. In the shown embodiment, the conductive structures 86 are formed directly against the two-dimensional material 52 of the ledges 72.

The conductive structures 86 are shown to be configured as a blocks, and in the illustrated embodiment are polygonal blocks. In other embodiments, the blocks may have other suitable shapes, including, for example, round, elliptical, etc.

The blocks 86 comprise conductive material 88. The conductive material 88 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 88 may comprise a same composition as one or both of the conductive materials 16 and 26 of the conductive structures 12 and 30. In some embodiments, the structures 86 may be referred to as conductive interconnect structures. In some embodiments, the structures 86 may be omitted.

The conductive structures 86 may be formed, for example, by etching openings to the ledges 72, filling such openings with conductive material 88, and then planarizing an upper surface of the assembly 10 to form the shown planarized surface 89.

Figure 11A:
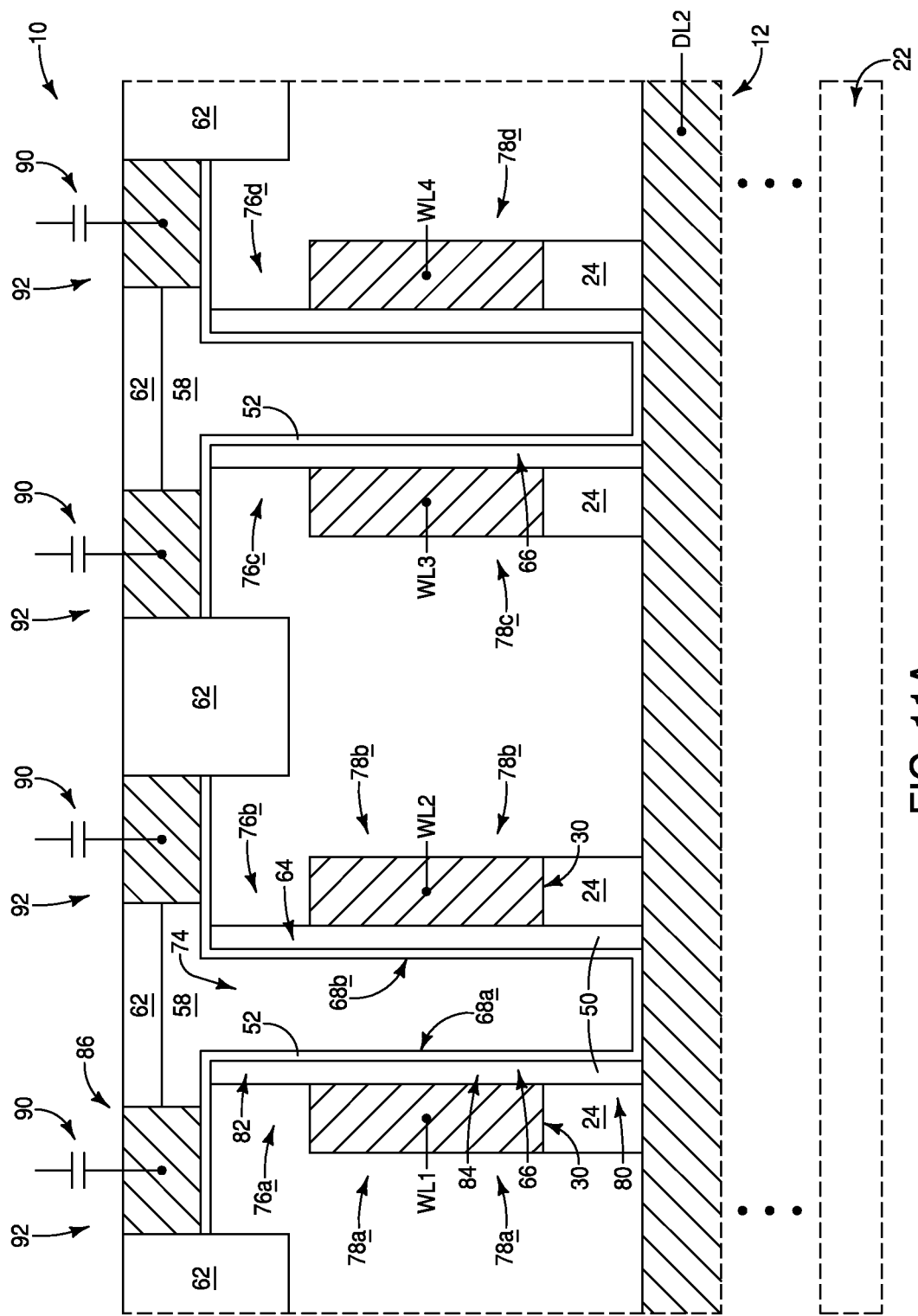

The transistors (access devices) 76 may be incorporated into a memory array. For instance, FIGS. 11 and 11A show storage elements 90 electrically coupled with the upper source/drain regions 82 through the conductive structures (interconnects) 86. The storage elements 90 are shown to be capacitors. It is to be understood, however, that the storage elements 90 may be any suitable devices having at least two detectable states; and in some embodiments may be, for example, capacitors, resistive-memory devices, conductive-bridging devices, phase-change-memory (PCM) devices, programmable metallization cells (PMCs), etc. If the storage elements are capacitors, they may be either ferroelectric capacitors (i.e., may comprise ferroelectric insulative material between a pair of capacitor electrodes) or may be non-ferroelectric capacitors (i.e., may comprise only non-ferroelectric insulative material between a pair of capacitor electrodes). Example ferroelectric insulative material may include one or more of transition metal oxide, zirconium, zirconium oxide, niobium, niobium oxide, hafnium, hafnium oxide, lead zirconium titanate, and barium strontium titanate. Example non-ferroelectric insulative material may comprise, consist essentially of, or consist of silicon dioxide.

The storage elements and access devices 76 together form memory cells 92 of a memory array 94.

The conductive lines 12 of FIGS. 11 and 11A are shown to correspond to digit lines DL1-DL4, and the conductive lines 30 are shown to correspond to wordlines WL1-WL4. The two-dimensional-material 52 along the sidewall regions 68 of the container-shaped structures 66 is active material within the transistors (VFETs) 76.

The digit lines DL1-DL4 extend along a first direction corresponding to the illustrated x-axis direction, and the wordlines WL1-WL4 extend along a second direction corresponding to the illustrated y-axis direction. The second direction of the wordlines crosses the first direction of the digit lines. In the shown embodiment, the second direction of the wordlines is orthogonal to (or at least substantially orthogonal to) the first direction of the digit lines, with the term "substantially orthogonal" meaning orthogonal to within reasonable tolerances of fabrication and measurement. In other embodiments, the wordlines may cross the digit lines at other angles.

The wordlines (e.g., WL1) and digit lines (e.g., DL1) are shown to be substantially straight. In other embodiments, the wordlines and/or the digit lines may be curved, wavy, etc.

Figure 12:
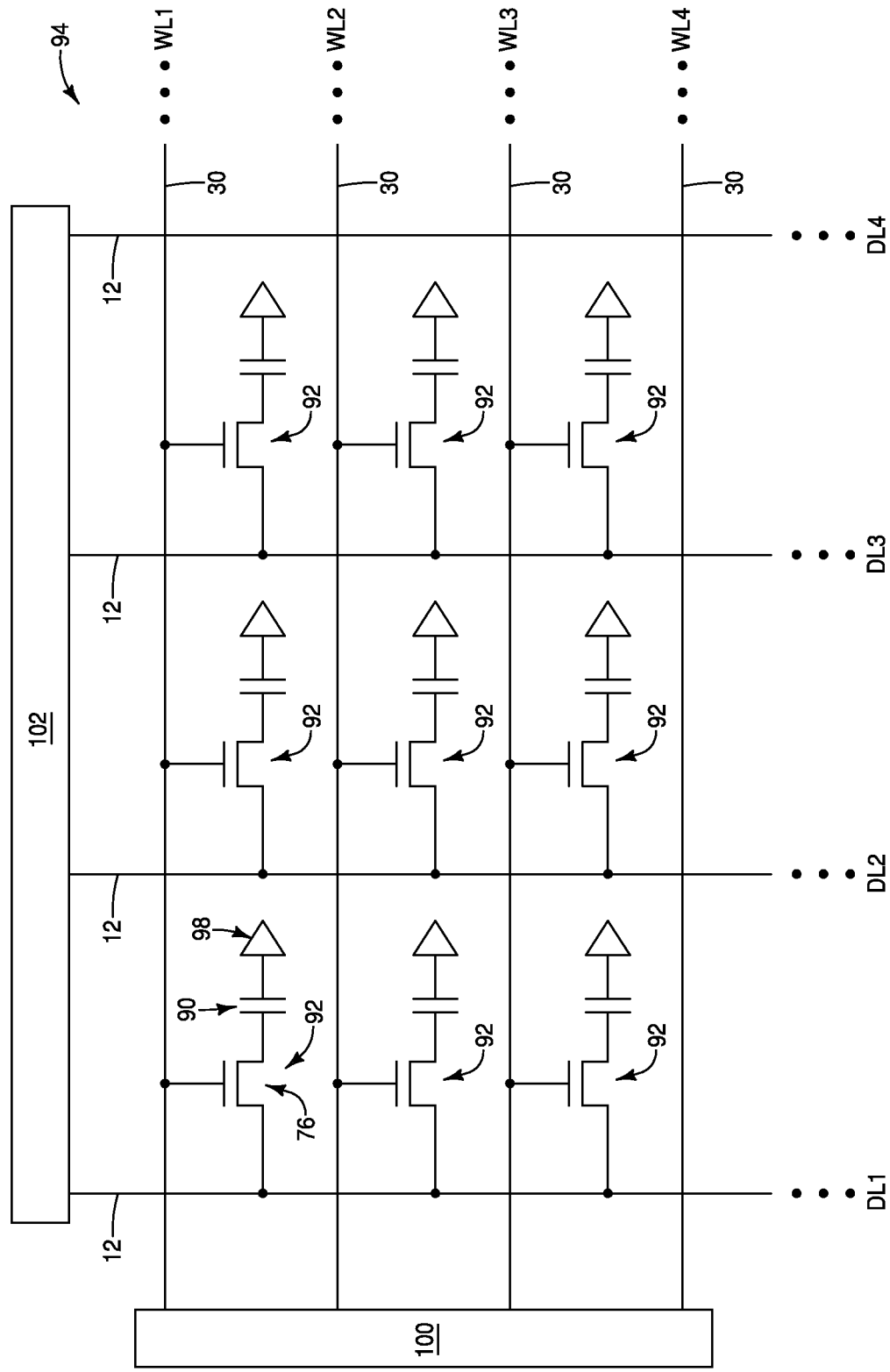
FIG. 12 is a diagrammatic schematic view of a region of an example memory array.

The memory array 94 described above may have any suitable configuration. FIG. 12 shows an example configuration in which the storage elements 90 are capacitors. The capacitors may be non-ferroelectric capacitors, and accordingly the memory array 94 may be a dynamic random access memory (DRAM) array. Alternatively, the capacitors may be ferroelectric capacitors, and accordingly the memory array 94 may be a ferroelectric random access memory (FeRAM) array.

The illustrated capacitors 90 each have an electrical node coupled with an access transistor 76, and have another electrical node coupled with a reference 98. The reference 98 may correspond to any suitable reference voltage, including, ground, VCC/2, etc.

The wordlines 30 are shown coupled with wordline-driver-circuitry 100, and the digit lines 12 are shown coupled with sense-amplifier-circuitry 102. The access transistors 76 and storage elements 90 together form the memory cells 92, with each of the memory cells being uniquely addressed by one of the digit lines 12 in combination with one of the wordlines 30.

The various structures, openings, trenches, etc., described herein may be patterned with any suitable processing. For instance, a photolithographically-patterned photoresist mask may be utilized to define locations of the structures, openings, trenches, etc.; one or more etches may be utilized to make the structures, openings, trenches, etc.; and then the mask may be removed.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having two-dimensional-material configured as an upwardly-opening container-shape. The container-shape has a first sidewall region, a second sidewall region, and a bottom region extending from the first sidewall region to the second sidewall region. Each of the first and second sidewall regions includes a lower source/drain region, an upper source/drain region, and a channel region between the upper and lower source/drain regions. A first insulative material is adjacent to the first sidewall region and on an opposing side of the first sidewall region from an interior region of the container shape. A second insulative material is adjacent to the second sidewall region and on an opposing side of the second sidewall region from the interior region of the container shape. A first gating structure is adjacent to the first insulative material and operatively proximate the channel region of the first sidewall region. A first transistor includes the first sidewall region, the first insulative material and the first gating structure. A second gating structure is adjacent to the second insulative material and operatively proximate the channel region of the second sidewall region. A second transistor includes the second sidewall region, the second insulative material and the second gating structure.

Some embodiments include an integrated assembly having first conductive structures extending along a first direction. Spaced-apart upwardly-opening container-shapes are over the first conductive structures. Each of the container-shapes has a first sidewall region, a second sidewall region, and a bottom region extending from the first sidewall region to the second sidewall region. Each of the first and second sidewall regions includes a lower source/drain region, an upper source/drain region, and a channel region between the upper and lower source/drain regions. The lower source/drain regions are electrically coupled with the first conductive structures. Second conductive structures extend along a second direction which crosses the first direction. The second conductive structures have gate regions operatively adjacent the channel regions. Storage elements are electrically coupled with the upper source/drain regions.

Some embodiments include a method of forming an integrated assembly. A construction is formed to have first conductive structures extending along a first direction and spaced from one another along a second direction. Intervening first insulative regions are between the spaced-apart first conductive structures. Second conductive structures are formed over the first conductive structures and extend along a second direction which crosses the first direction. The second conductive structures are spaced from the construction by intervening second insulative regions. The second conductive structures are arranged in pairs. Each paired arrangement of the second conductive structures has an inner region between the conductive structures of the paired arrangement, has a first outer region on an opposing side of one of the conductive structures of the paired arrangement from the inner region, and has a second outer region on an opposing side of the other of the conductive structures of the paired arrangement from the inner region. Insulative material is formed over the outer regions of the paired arrangements. Trenches extend through the insulative material and through the inner regions of the paired arrangements. Each of the trenches has a first sidewall surface and an opposing second sidewall surface along a cross-section. Dielectric material is formed along the first and second sidewall surfaces of the trenches to narrow the trenches. Two-dimensional-material is formed to extend substantially conformally along the insulative material and the dielectric material. The two-dimensional-material is arranged as strips extending along the first direction. The strips of the two-dimensional-material are directly over the first conductive structures. The strips are patterned into segments. Each of the segments includes an upwardly-opening container-shape which extends into an associated one of the trenches. The container-shape includes a pair of sidewall regions, and includes a bottom region extending between the sidewall regions. The sidewall regions include upper source/drain regions, lower source/drain regions, and channel regions between the upper and lower source/drain regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:
1. An integrated assembly, comprising:
two-dimensional-material configured as an upwardly-opening container-shape; the container-shape having a first sidewall region, a second sidewall region, and a bottom region extending from the first sidewall region to the second sidewall region; each of the first and second sidewall regions include a lower source/drain region, an upper source/drain region, and a channel region between the upper and lower source/drain regions;
a first insulative material adjacent the first sidewall region and on an opposing side of the first sidewall region from an interior region of the container shape;
a second insulative material adjacent the second sidewall region and on an opposing side of the second sidewall region from the interior region of the container shape;
a first gating structure adjacent to the first insulative material and operatively proximate the channel region of the first sidewall region; a first transistor comprising the first sidewall region, the first insulative material and the first gating structure; and
a second gating structure adjacent to the second insulative material and operatively proximate the channel region of the second sidewall region; a second transistor comprising the second sidewall region, the second insulative material and the second gating structure.
2. The integrated assembly of claim 1 wherein the container-shape further comprises:
a first ledge region over the first sidewall region and projecting laterally outwardly from the interior region of the container-shape; and
a second ledge region over the second sidewall region and projecting laterally outwardly from the interior region of the container-shape.
3. The integrated assembly of claim 2 wherein the first and second ledge regions are over and directly against the first and second insulative materials, respectively.
4. The integrated assembly of claim 2 comprising:
a first conductive block supported at least in part by the first ledge region and directly against the first ledge region; and
a second conductive block supported at least in part by the second ledge region and directly against the second ledge region.
5. The integrated assembly of claim 4 comprising storage elements electrically coupled with the upper source/drain regions through the conductive blocks.
6. The integrated assembly of claim 5 wherein the storage elements are capacitors.
7. The integrated assembly of claim 5 wherein the storage elements are ferroelectric capacitors.
8. The integrated assembly of claim 5 wherein the storage elements are nonferroelectric capacitors.
9. The integrated assembly of claim 1 wherein the two-dimensional-material comprises one or more of carbon, boron, germanium, silicon, phosphorus, bismuth, indium, molybdenum, platinum, rhenium, tin, tungsten and hafnium.
10. The integrated assembly of claim 1 wherein the two-dimensional-material comprises one or more of graphene, graphyne, borophene, germanene, silicene, $Si_2BN$, stanene, phosphorene, bismuthene, molybdenum disulfide, molybdenum diselenide, tungsten disulfide, tungsten diselenide, tin disulfide, rhenium disulfide, indium disulfide, and hafnium disulfide.
11. The integrated assembly of claim 1 wherein the two-dimensional-material comprises a stack consisting of 1 to 10 separate layers.
12. The integrated assembly of claim 1 wherein the two-dimensional-material comprises a thickness within a range of from about 0.5 nm to about 5 nm.
13. The integrated assembly of claim 1 wherein the two-dimensional-material is substantially entirely monocrystalline.
14. An integrated assembly, comprising:
first conductive structures extending along a first direction;
spaced-apart upwardly-opening container-shapes over the first conductive structures; each of the container-shapes comprises two-dimensional-material and having a first sidewall region, a second sidewall region, and a bottom region extending from the first sidewall region to the second sidewall region; each of the first and second sidewall regions including a lower source/drain region, an upper source/drain region, and a channel region between the upper and lower source/drain regions; the lower source/drain regions being electrically coupled with the first conductive structures;
second conductive structures extending along a second direction which crosses the first direction; the second conductive structures having gate regions operatively adjacent the channel regions, each gate region comprising a single structure operatively adjacent a single channel region; and
storage elements electrically coupled with the upper source/drain regions.

15. The integrated assembly of claim 14 wherein VFET devices comprise the channel regions and the source/drain regions; and wherein the first and second sidewall regions of each of the container-shapes are within different VFET devices relative to one another.

16. The integrated assembly of claim 14 wherein the first conductive structures are digit lines electrically coupled with sense-amplifier-circuitry.

17. The integrated assembly of claim 14 wherein the second conductive structures are wordlines electrically coupled with wordline-driver-circuitry.

18. The integrated assembly of claim 14 wherein the storage elements include capacitors.

19. The integrated assembly of claim 18 wherein the capacitors are non-ferroelectric capacitors.

20. The integrated assembly of claim 18 wherein the capacitors are ferroelectric capacitors.

21. The integrated assembly of claim 14 wherein the two-dimensional-material comprises one or more of boron, phosphorus, bismuth, indium, platinum, rhenium, tin, and hafnium.

22. The integrated assembly of claim 14 wherein the two-dimensional-material comprises one or more of, borophene, $Si_2BN$, stanene, phosphorene, bismuthene, molybdenum diselenide, tungsten diselenide, tin disulfide, rhenium disulfide, indium disulfide, and hafnium disulfide.

23. The integrated assembly of claim 14 wherein the two-dimensional-material is substantially entirely monocrystalline.

24. The integrated assembly of claim 14 wherein each of the container-shapes further comprises:
  a first ledge region over the first sidewall region and projecting laterally outwardly from an interior region of the container-shape; and
  a second ledge region over the second sidewall region and projecting laterally outwardly from the interior region of the container-shape.

25. The integrated assembly of claim 24 comprising third conductive structures supported at least in part by the ledge regions; and wherein the electrical coupling of the storage elements with the upper source/drain regions is through the third conductive structures.

26. The integrated assembly of claim 14 wherein the two-dimensional-material is configured as spaced-apart linear structures directly over respective digit lines.

27. The integrated assembly of claim 14 wherein the two-dimensional-material comprises a thickness in a range of from about 0.5 nm to about 5 nm.

28. The integrated assembly of claim 14 wherein the two-dimensional-material comprises a stack of 2-10 separate layers.

29. The integrated assembly of claim 14 wherein the two-dimensional-material contacts a digit line.

30. The integrated assembly of claim 14 wherein at least a portion of the two-dimensional-material extends perpendicularly to a digit line.

31. The integrated assembly of claim 14 wherein the two-dimensional-material comprises a material having one or more layers with stronger forces within each layer than along edges of the layers.

32. The integrated assembly of claim 31 wherein the forces along edges of the layers comprise van der Waals forces.

33. The integrated assembly of claim 14 wherein the bottom region of the upwardly-opening container-shapes is defined by the two-dimensional material.

34. The integrated assembly of claim 14 wherein the two-dimensional-material does not extend from one container-shape to another container-shape.

35. The integrated assembly of claim 14 wherein each storage element is electrically isolated from another storage element.

36. The integrated assembly of claim 14 wherein each upper source/drain region is electrically isolated from another upper source/drain region.

37. A method of forming an integrated assembly, comprising:
  forming a construction having first conductive structures extending along a first direction and spaced from one another along a second direction; intervening first insulative regions being between the spaced-apart first conductive structures;
  forming second conductive structures over the first conductive structures and extending along a second direction which crosses the first direction; the second conductive structures being spaced from the construction by intervening second insulative regions; the second conductive structures being arranged in pairs; each paired arrangement of the second conductive structures having an inner region between the conductive structures of the paired arrangement, having a first outer region on an opposing side of one of the conductive structures of the paired arrangement from the inner region, and having a second outer region on an opposing side of the other of the conductive structures of the paired arrangement from the inner region;
  forming insulative material over the outer regions of the paired arrangements; trenches extending through the insulative material and through the inner regions of the paired arrangements; each of the trenches having a first sidewall surface and an opposing second sidewall surface along a cross-section;
  forming dielectric material along the first and second sidewall surfaces of the trenches to narrow the trenches;
  forming two-dimensional-material to extend substantially conformally along the insulative material and the dielectric material; the two-dimensional-material being arranged as strips extending along the first direction; the strips of the two-dimensional-material being directly over the first conductive structures; and
  patterning the strips into segments; each of the segments including an upwardly-opening container-shape which extends into an associated one of the trenches; the container-shape including a pair of sidewall regions, and including a bottom region extending between the sidewall regions; the sidewall regions including upper source/drain regions, lower source/drain regions, and channel regions between the upper and lower source/drain regions.

38. The method of claim 37 further comprising forming storage elements electrically coupled with the upper source/drain regions.

39. The method of claim 37 wherein the trenches extend to the first conductive structures, and wherein the two-dimensional-material is formed directly against the first conductive structures at bottoms of the trenches.

40. The method of claim 39 wherein each of the segments includes a pair of ledge regions, with one of the ledge regions extending outwardly from one of the sidewall regions, and with the other of the ledge regions extending outwardly from the other of the sidewall regions; and further comprising forming storage elements over the ledge regions and electrically coupled to the ledge regions.

41. The method of claim 40 further comprising:
forming conductive material over the ledge regions; and
electrically coupling the storage elements to the ledge regions through the conductive material.

42. The method of claim 39 wherein the first conductive structures are digit lines, and wherein the second conductive structures are wordlines.

43. The method of claim 37 wherein the two-dimensional-material comprises one or more of graphene, graphyne, borophene, germanene, silicene, $Si_2BN$, stanene, phosphorene, bismuthene, molybdenum disulfide, molybdenum diselenide, tungsten disulfide, tungsten diselenide, tin disulfide, rhenium disulfide, indium disulfide, and hafnium disulfide.

44. The method of claim 37 wherein the two-dimensional-material is substantially entirely monocrystalline.

* * * * *